(12) United States Patent
Chianghsieh et al.

(10) Patent No.: US 12,707,585 B2
(45) Date of Patent: Aug. 11, 2026

(54) MOUNTING SYSTEM FOR PRINTED CIRCUIT BOARDS

(71) Applicant: HEWLETT PACKARD ENTERPRISE DEVELOPMENT LP, Spring, TX (US)

(72) Inventors: Peng Chianghsieh, Taipei (TW); Yu-Shun Chang, Taipei (TW); Chi-Ting Yang, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 169 days.

(21) Appl. No.: 18/816,076

(22) Filed: Aug. 27, 2024

(65) Prior Publication Data

US 2026/0068070 A1 Mar. 5, 2026

(51) Int. Cl.

| | |
|---|---|
| ***G06F 1/16*** | (2006.01) |
| ***H05K 5/00*** | (2025.01) |
| ***H05K 7/00*** | (2006.01) |
| ***H05K 7/14*** | (2006.01) |

(52) U.S. Cl.
CPC ......... *H05K 7/1417* (2013.01); *H05K 7/1424* (2013.01)

(58) Field of Classification Search
CPC .. H05K 7/1417; H05K 7/1424; H05K 7/1422; H05K 7/1425; H05K 7/1418; H05K 7/142; H05K 7/14
See application file for complete search history.

(56) References Cited

U.S. PATENT DOCUMENTS

| | | | | |
|---|---|---|---|---|
| 4,824,398 A * | 4/1989 | Taylor | H01R 12/716 439/83 |
| 5,460,543 A * | 10/1995 | Kosmala | H05K 7/142 439/567 |
| 5,796,593 A | 8/1998 | Mills et al. | |
| 5,963,432 A * | 10/1999 | Crowley | H05K 7/142 411/509 |
| 6,280,202 B1 * | 8/2001 | Alden, 3rd | H05K 7/142 439/573 |
| 6,377,445 B1 * | 4/2002 | Davis | H05K 7/142 361/752 |
| 6,424,538 B1 * | 7/2002 | Paquin | H05K 7/142 361/752 |

(Continued)

*Primary Examiner* — Anthony M Haughton
(74) *Attorney, Agent, or Firm* — Hewlett Packard Enterprise Patent Department

(57) ABSTRACT

Mounting system for PCBs includes a cylindrical standoff and a fastener. The cylindrical standoff has a first end coupled to a support and a second end having a fastener hole, and multi-tiered shoulders formed between the first and second ends to interchangeably receive and mount respectively compatible PCBs to the support. Each shoulder includes an upward facing mounting face, where respective mounting faces have different heights and outer radii relative to one another such that the shoulders are respectively compatible with different PCBs having different PCB thicknesses and mounting hole diameters. In a mounted state of a given PCB having top and bottom faces, on the shoulder: the mounting face of one shoulder compatible with the given PCB engages with the bottom face, and the fastener extends through the mounting hole and into the fastener hole and engages the top face to releasably attach the given PCB to the support.

20 Claims, 9 Drawing Sheets

(56) References Cited

U.S. PATENT DOCUMENTS

| | | | | |
|---|---|---|---|---|
| 6,493,233 | B1 | 12/2002 | De Lorenzo et al. | |
| 6,542,372 | B1 * | 4/2003 | Paquin | H05K 7/142 361/770 |
| 7,034,223 | B2 * | 4/2006 | Fan | G06F 1/184 361/753 |
| 7,535,721 | B2 * | 5/2009 | Okoshi | H05K 5/0234 361/752 |
| 7,564,683 | B2 * | 7/2009 | Hood, III | G06F 1/184 361/752 |
| 9,374,900 | B2 * | 6/2016 | Huffman | H05K 1/144 |
| 9,521,789 | B2 * | 12/2016 | Grossman | H05K 9/0037 |
| 9,814,128 | B1 * | 11/2017 | Wynar | H01R 12/523 |
| 2005/0159030 | A1 * | 7/2005 | Hsu | H05K 7/142 439/74 |
| 2005/0201070 | A1 * | 9/2005 | Fan | G06F 1/184 361/756 |
| 2006/0090927 | A1 * | 5/2006 | Edwards | H05K 7/142 174/138 G |
| 2021/0289652 | A1 * | 9/2021 | Fan | F16B 5/02 |
| 2025/0120033 | A1 * | 4/2025 | Kumarapuram Anantharaman | H05K 1/144 |
| 2025/0224781 | A1 * | 7/2025 | Liu | G06F 1/185 |
| 2025/0234473 | A1 * | 7/2025 | Bassman | H05K 7/1407 |

* cited by examiner 100, 200
102
103
104
105
106
107
108
108A
108B
110
112
114
116, 116A
116, 116B
C
$D_F$
$D_{R1}$
$D_{R2}$
$H_1$
$H_2$ 100
202
204
205
206
208
210
212
L, D
$D_1$
$D_2$
$D_3$ 200
252
254
255
256
262
$D_4$ 801A
754
756
914A
752
762
904A
D_M1
702
910-1
D_4
914A
T_1
908-1
752
700
702
802
716, 716A
716, 716B
706
504
712
D_R2
714
D_R1
708, 708B
708, 708A
702
710

904B
914B
$D_{M2}$
914B
$T_2$ 904B
708A
708, 708B
714
914B
716, 716B
702
910-2

914B
752
754
908-2

MOUNTING SYSTEM FOR PRINTED CIRCUIT BOARDS

BACKGROUND

Printed circuit boards (PCBs) may be directly installed in a chassis of an information processing device using screws. Alternatively, the PCBs may be first installed in a tray using screws and later the tray may be slid into the chassis to indirectly install the PCB to the chassis. In all such examples, the screws may extend through a PCB's substrate into bosses that is coupled to the chassis or the tray so as to secure the PCBs to the information processing device.

BRIEF DESCRIPTION OF THE DRAWINGS

Various examples will be described below with reference to the following figures.

DETAILED DESCRIPTION

Figures 1, 2A, 2B:
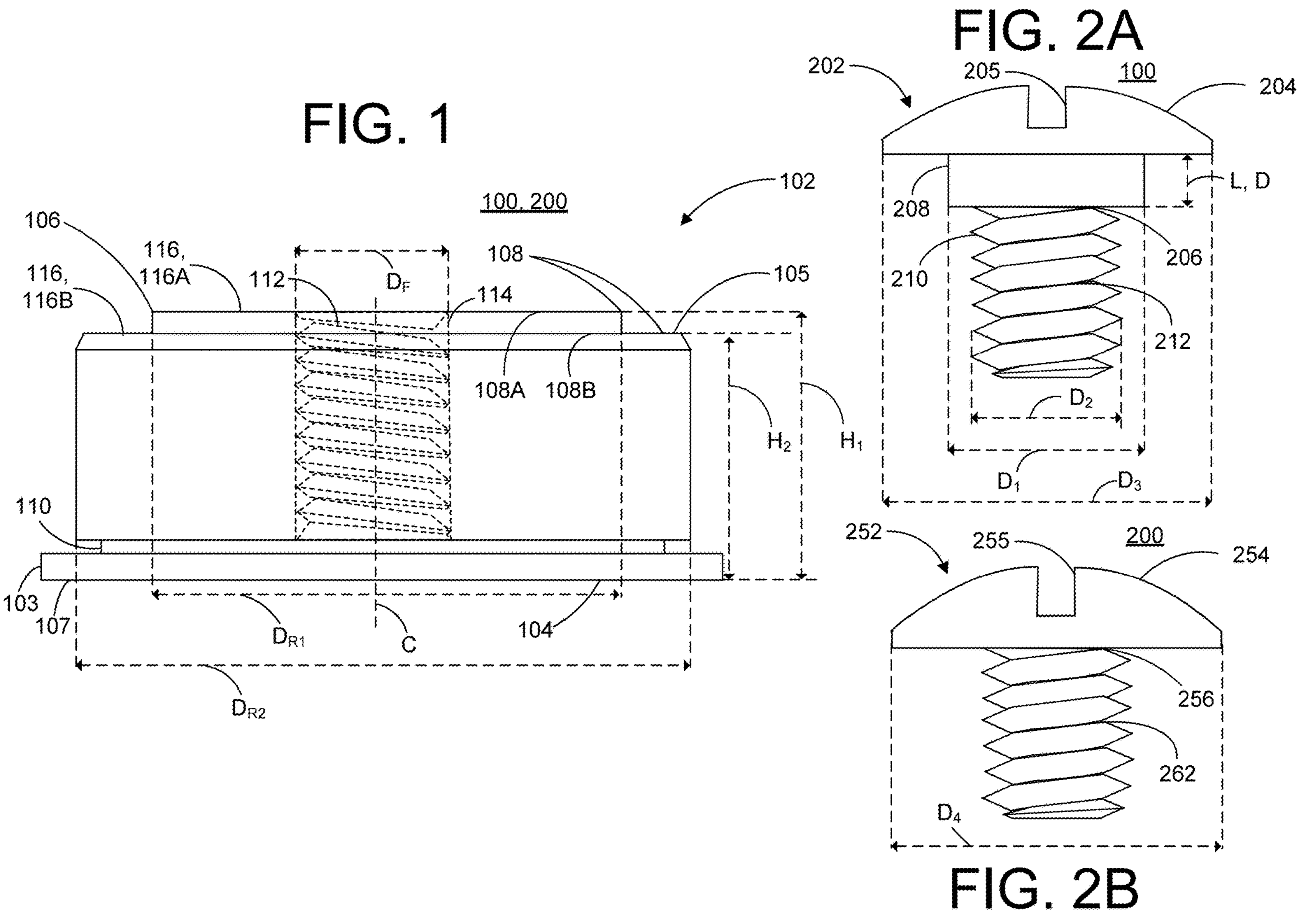
FIG. 1 includes a schematic side view of a cylindrical standoff according to an example of the present disclosure.
FIG. 2A includes a schematic side view of a fastener which, together with the cylindrical standoff of FIG. 1, forms a first mounting system according to an example of the present disclosure.
FIG. 2B includes a schematic side view of another fastener that, together with the cylindrical standoff of FIG. 1, forms a second mounting system according to an example of the present disclosure.

The following detailed description refers to the accompanying drawings. For purposes of explanation, certain examples are described with reference to the components illustrated in FIGS. 1-7. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

Mounting holes are provided in a printed circuit board (PCB) and a support structure of an information processing device to allow screws to extend therethrough the PCB and the support structure and secure the PCB to the information processing device. However, manufacturers may specify a minimum separation dimension (e.g., predetermined height) between the PCB and the support structure so as to maintain a gap between protruding leads in the PCB and the support structure sheet metal to avoid electrical short circuits and to additionally align one or more auxiliary electronic components such as USB ports, serial ports, or the like mounted to the PCB, with corresponding cutouts formed in the rear or front panels of the information processing device. It may be noted that the desired predetermined height may be a height defined between a base of the support structure and a top face of the PCB. Therefore, the support structure may include mounting structures that allow the PCB to be mounted thereon and maintain the desired height between the PCB and the support structure. Generally, the mounting structures are designed for mounting the PCB having a predetermined thickness such that the mounting structure can maintain the desired predetermined height between the PCB and the support structure. However, the information processing device may be required to use PCBs that are available in multiple different thickness. In such cases, when the information processing device uses a PCB having a thickness that is different from that of the predetermined thickness, the mounting structures may not be able to maintain the desired predetermined height between the support structure and the PCB, thereby resulting in either misalignment between the auxiliary electronic components and the corresponding cutouts or may even position the PCB too close to the support structure, which may cause electrical short circuits. To overcome such issues, the information processing device may require multiple types of support structures, each having mounting structures of a predefined height corresponding to a PCB thickness or may require a packing material such as washers, spacers, or the like disposed on the mounting structures so as to maintain the desired predetermined height between the PCB and the support structure.

Accordingly, when multiple types of support structures are made available, customers may need to order different types of support structures based on the thickness of the PCB which suits their requirements, and this may be cumbersome and difficult to manage. In addition, multiple numbers of different types of support structures may need to be produced, and this may result in additional SKUs being needed and different inventory to be maintained by the manufacturers, which can in turn increase costs. Furthermore, replacing the support structure with a new type of support structure may be cumbersome, time consuming, expensive, and depend on the availability of inventory of such new support structure.

Further, the packing material may be a loose component of the information processing device. Hence, maintaining the packing material in place on the mounting structure while installing the PCB in the information processing device may be cumbersome, time consuming, and difficult to manage. Furthermore, the loose component may tend to be misplaced during maintenance activities, resulting in unavoidable delay in reinstating the information processing device during such maintenance activities.

A technical solution to the aforementioned problems includes providing a cylindrical standoff having multi-tiered shoulders that allows PCBs having multiple different thicknesses to be interchangeably mounted to respectively compatible shoulder of the cylindrical standoff while ensuring that a top face of the PCB which is opposite from the standoff, is at a same predetermined height (e.g., a desired predetermined height) above a support structure notwithstanding the differences in PCB thickness. Furthermore, in a mounted state of the PCB on the compatible shoulder of the cylindrical standoff, a fastener may extend therethrough a mounting hole of the PCB and into a fastener hole of the cylindrical standoff and engage the top face of the PCB to releasably attach the PCB to the support structure.

In some examples, the multi-tiered shoulders may be formed between a first end and a second end that is opposite to the first end of the cylindrical standoff. The first end may be configured to be coupled to the support structure and the second end has a fastener hole. In such examples, each shoulder has an upward facing mounting face. Furthermore, each shoulder has a different height measured from the first end of the cylindrical standoff to its mounting face and different radii measured from a central axis of the fastener hole to the respective mounting faces. The heights of the shoulders may decrease with each successive shoulder from the second end to the first end, and the radii of the shoulders increase with each successive shoulder from the second end to the first end.

Similarly, each of the PCBs may have a different mounting hole diameter and different PCB thickness. The PCB thickness and mounting hole diameter may increase with each successive corresponding shoulder from the second end to the first end of the cylindrical standoff. Further, the mounting hole diameter of each PCB may be smaller than the diameter of the compatible shoulder so as to allow the given PCB to be mounted on the compatible shoulder, but larger than the diameter of the next smallest shoulder so as to allow the given PCB to pass through the next smallest shoulder and mount on the compatible shoulder. In other words, each shoulder may be compatible to a different PCB thickness and may be arranged to contact a bottom face of that PCB when the PCB is mounted to the cylindrical standoff. Moreover, the height of each shoulder may be set such that, in the mounted state of the bottom face of the given PCB on the mounting face of the compatible shoulder, the height of the top face (i.e., opposite face) of the given PCB is at the predetermined height from the first end of the cylindrical standoff, where the predetermined height being the same for each of the shoulders.

In some examples, the fastener may include a head section and a body section having a shank portion connected to the head section and a threaded portion extending from the shank portion. In such examples, in the mounted state of the given PCB on the shoulder, the threaded portion extends through the mounting hole of the given PCB and into the fastener hole, the head section engages with the top face of the given PCB, and the shank portion engages with the mounting face of the foremost shoulder to prevent travel of the head section beyond a predetermined position and crushing of the given PCB between the fastener and the cylindrical standoff. In some other examples, the fastener includes a head section and a body section having threads connected to the head section. In such examples, in the mounted state of the given PCB on the compatible shoulder, the body section extends into the mounting hole of the given PCB and into the fastener hole, and the head section engages with the top face of the given PCB.

In some examples, the PCB may be a primary system board such as a motherboard of an information processing device and the support structure may be a chassis of the information processing device. In some other examples, the PCB may be a riser card of a riser assembly, and the support structure may be a riser cage of the riser assembly.

Since the cylindrical standoff may be designed to make it compatible with multiple different thicknesses of PCB, the cylindrical standoff provides flexibility, upgradability, serviceability, reduced costs, and supply chain benefits. In particular, there may be no need to maintain or produce different types of cylindrical standoffs in a support structure, each having different heights, and therefore the costs associated with designing and producing multiple types of support structure having the cylindrical standoffs can be avoided. In addition, the number of SKUs that are needed can be reduced and the need to maintain different inventories thereof can be avoided, which can in turn decrease costs. Further, since the cylindrical standoffs are not loose components of the information processing device, the cylindrical standoffs may not tend to be get misplaced during maintenance activities, thereby avoiding the delay in reinstating the information processing device during such maintenance activities. Additionally, a single fastener having a shank portion may be used to secure the PCBs of all different thickness to the support structure. This can further reduce the SKUs and simplify assembly. Additionally, the fastener having the shank can also prevent the PCB being crushed by the fastener because the foremost shoulder may stop the fastener at the right depth. Further, the same type of cylindrical standoffs may be used to secure any type of PCBs, e.g., a primary system board or a riser card to the support structure such as a chassis or a rise cage, thereby reducing the number of separate SKUs required to secure those independent PCBs to the support structure.

Referring to the Figures, FIGS. 1 and 2A depict a mounting system 100 (or a first mounting system) including one or more cylindrical standoffs 102 (one is shown in FIG. 1) and one or more fasteners 202 (one is shown in FIG. 2A). FIGS. 1 and 2B depict another mounting system 200 (or a second mounting system) which also includes one or more of the cylindrical standoffs 102 (one shown in FIG. 1) and one or more alternate fastener 252 (one is shown in FIG. 2B). The mounting system 200 is a variation of the mounting system 100 in which the alternate fastener 252 is used in lieu of the fastener 202. It should be understood that FIGS. 1 and 2A-2B are not intended to illustrate specific shapes, dimensions, or other structural details accurately or to scale, and that implementations of the mounting systems 100 and 200 may have different numbers and arrangements of the illustrated components and may also include other parts that are not illustrated.

The cylindrical standoff 102 may be a support element configured to secure a printed circuit board (PCB) to a support structure (e.g., a chassis of an information processing device, a riser cage bracket, a primary system board, etc.) while also holding the PCB some distance apart from (i.e., elevated relative to) the support structure. For example, the cylindrical standoff 102 may be configured to be attached to, or may be part of, an information processing device (e.g., information processing devices 301A, 301B, 301C, or 301D, as shown in FIGS. 3A-3D). In the example of FIG. 1, the cylindrical standoff 102 includes a first end 104, a second end 106 opposite to the first end 104, and multi-tiered shoulders 108.

Figures 3A, 3B:
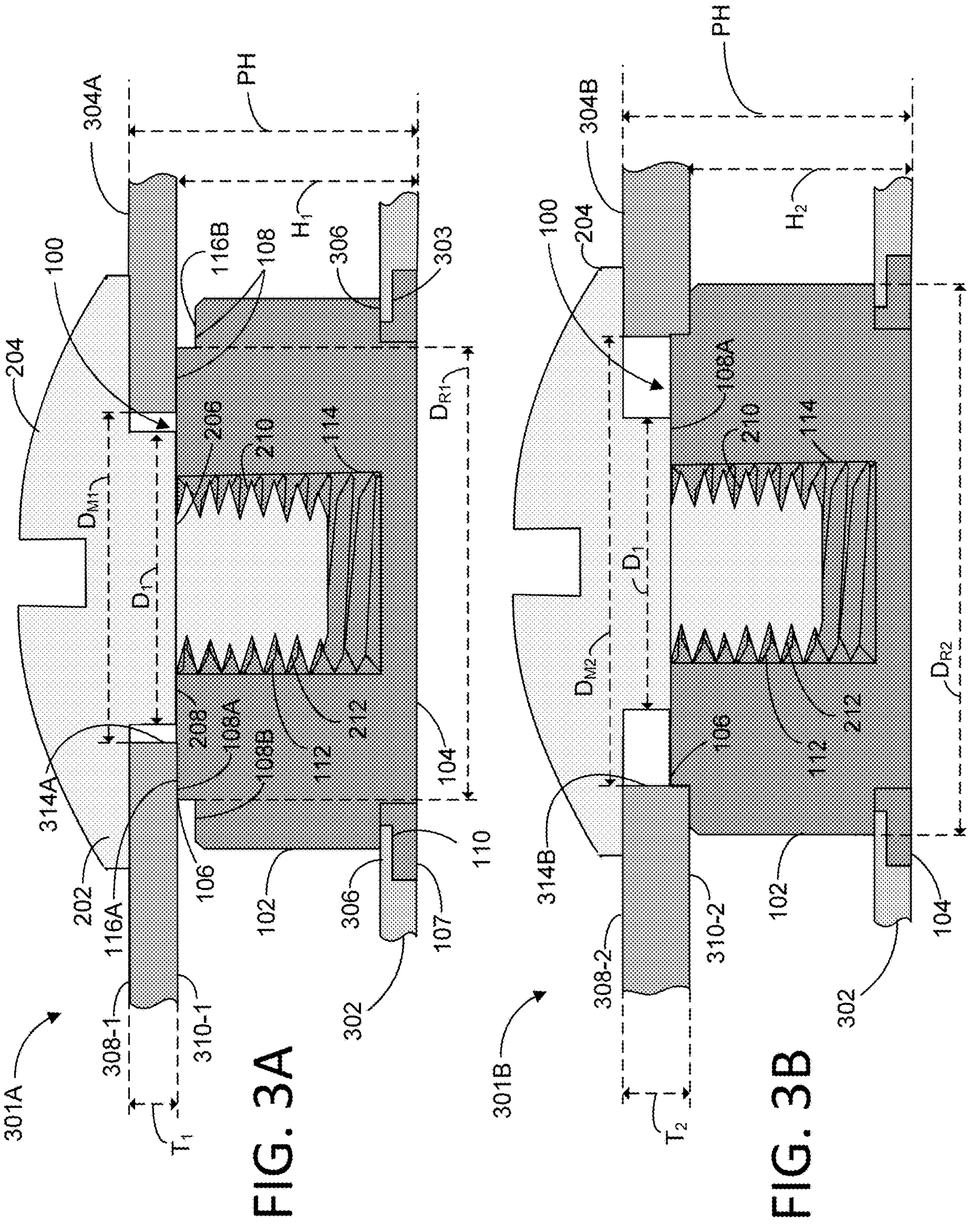
FIG. 3A includes a cross-section of a portion of an information processing device having a support structure, a first printed circuit board, and the first mounting system including the cylindrical standoff of FIG. 1 and the fastener of FIG. 2A according to an example of the present disclosure.
FIG. 3B includes a cross-section of a portion of another information processing device having a support structure, a second printed circuit board, and the first mounting system including the cylindrical standoff of FIG. 1 and the fastener of FIG. 2A according to an example of the present disclosure.
Figures 3C, 3D:
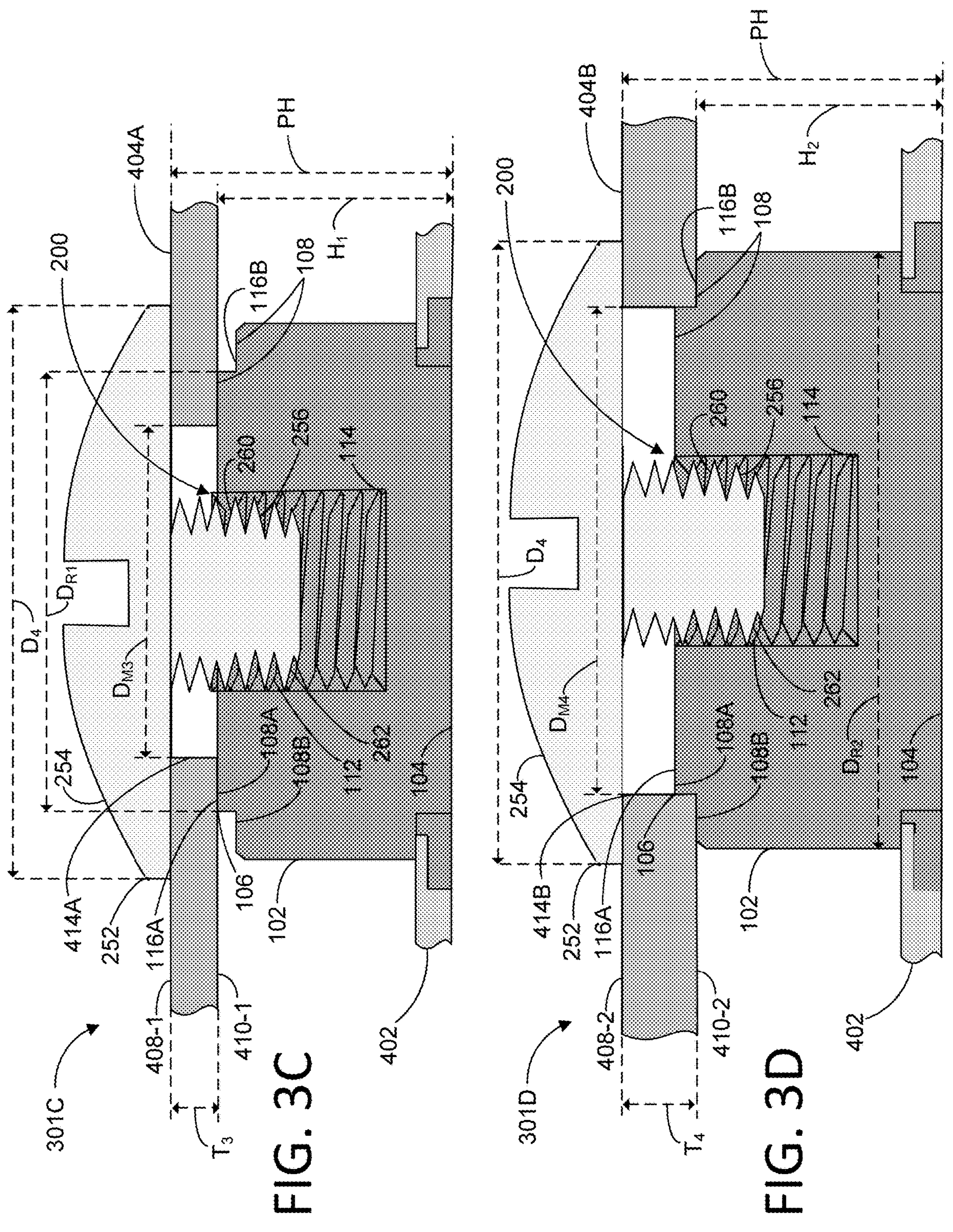
FIG. 3C includes a cross-section of a portion of an information processing device having a support structure, a third printed circuit board, and the second mounting system including the cylindrical standoff of FIG. 1 and the fastener of FIG. 2B according to an example of the present disclosure.
FIG. 3D includes a cross-section of a portion of another information processing device having a support structure, a fourth printed circuit board, and the second mounting system including the cylindrical standoff of FIG. 1 and the fastener of FIG. 2B according to an example of the present disclosure.

The cylindrical standoff 102 may be used to mount a component e.g., a printed circuit board (PCB) (e.g., PCB 304, as shown in FIGS. 3A-3B, or PCB 404, as shown in FIGS. 3C-3D) within an information processing device such that the mounted component is raised or elevated above another component e.g., a support structure (e.g., support structure 302, as shown in FIGS. 3A-3B or support structure 402, as shown in FIGS. 3C-3D) of the information processing device. The cylindrical standoff 102 has first and second ends 104, 106, respectively, and a fixed height $H_1$ between the first and second ends 104, 106. The cylindrical standoff 102 also includes a standoff attachment portion 103 and a PCB mounting portion 105, which together extend between the first and second ends 104, 106.

The standoff attachment portion 103 includes an engagement groove 110 and a lip 107 that may be configured to engage with the support structure so as to couple the cylindrical standoff 102 to the support structure. For example, a portion of the support structure 302 may be received in engagement groove 110 such that lip 107 is disposed on one side of the support structure 302 while PCB mounting portion 105 is disposed on the other side. An example of such coupling will be described in greater detail below with reference to FIGS. 3A-3D.

The PCB mounting portion 105 includes multiple concentric shoulders 108 arranged in tiers having different heights and different diameters. The PCB mounting portion 105 also includes a fastener hole 114 extending through the shoulders 108 along an axis parallel to (in some cases, coaxial with) a central axis C of the cylindrical standoff 102. The fastener hole 114 begins with an opening in the second end 106 and extends from the second end 106 towards the first end 104. In some cases, the fastener hole 114 terminates within the cylindrical standoff 102 prior to reaching the first end 104, such that the fastener hole 114 has a certain length that is less than the height $H_1$ of the cylindrical standoff 102, e.g., three-fourth the height of the cylindrical standoff 102. In other examples, the fastener hole 114 extends fully through the cylindrical standoff 102 such that the fastener hole 114 also has a second opening (not illustrated) in the first end 104. In the example of FIG. 1, the fastener hole 114 includes threads 112 to engage with a threaded fastener (e.g., fastener 202 or 252 of FIG. 2A or 2B), but in other examples the fastener hole 114 could omit such threads (e.g., in cases where the cylindrical standoff 102 is used with a non-threaded fastener, such as a rivet).

Figure 4A:
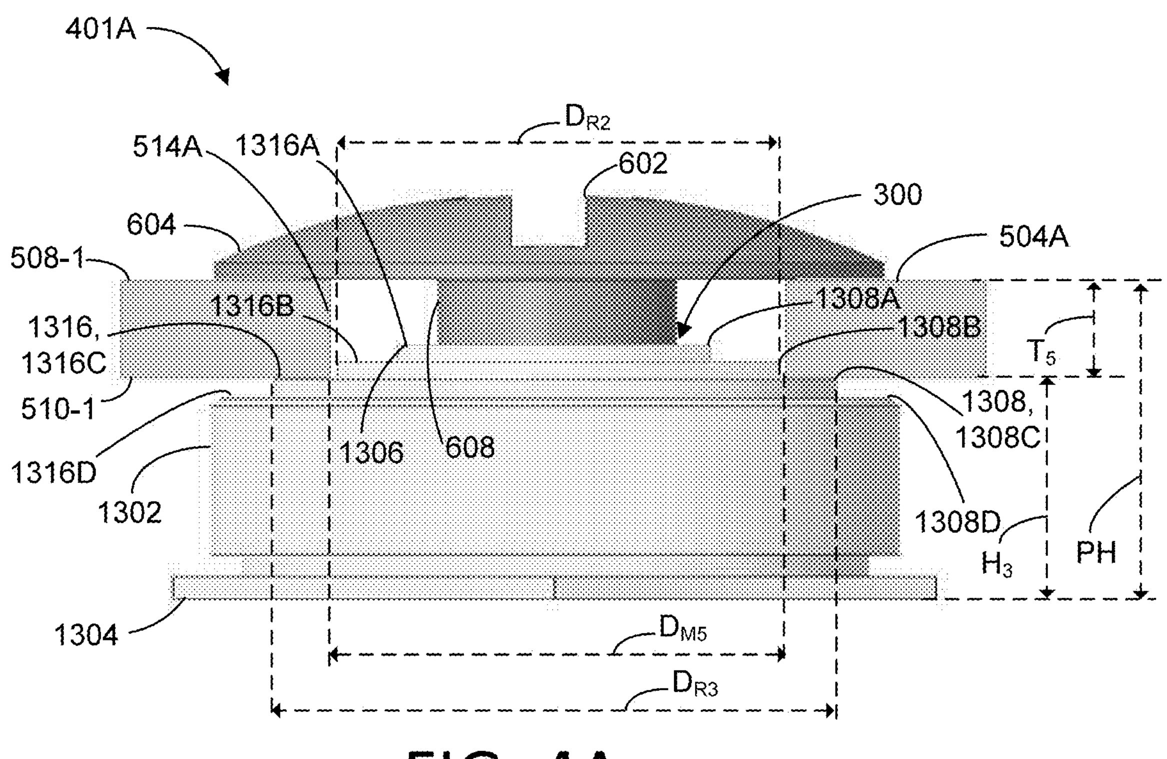
FIG. 4A includes a block diagram of a portion of another information processing device having a fifth printed circuit board and a third mounting system including a cylindrical standoff and a fastener according to an example of the present disclosure.
Figure 4B:
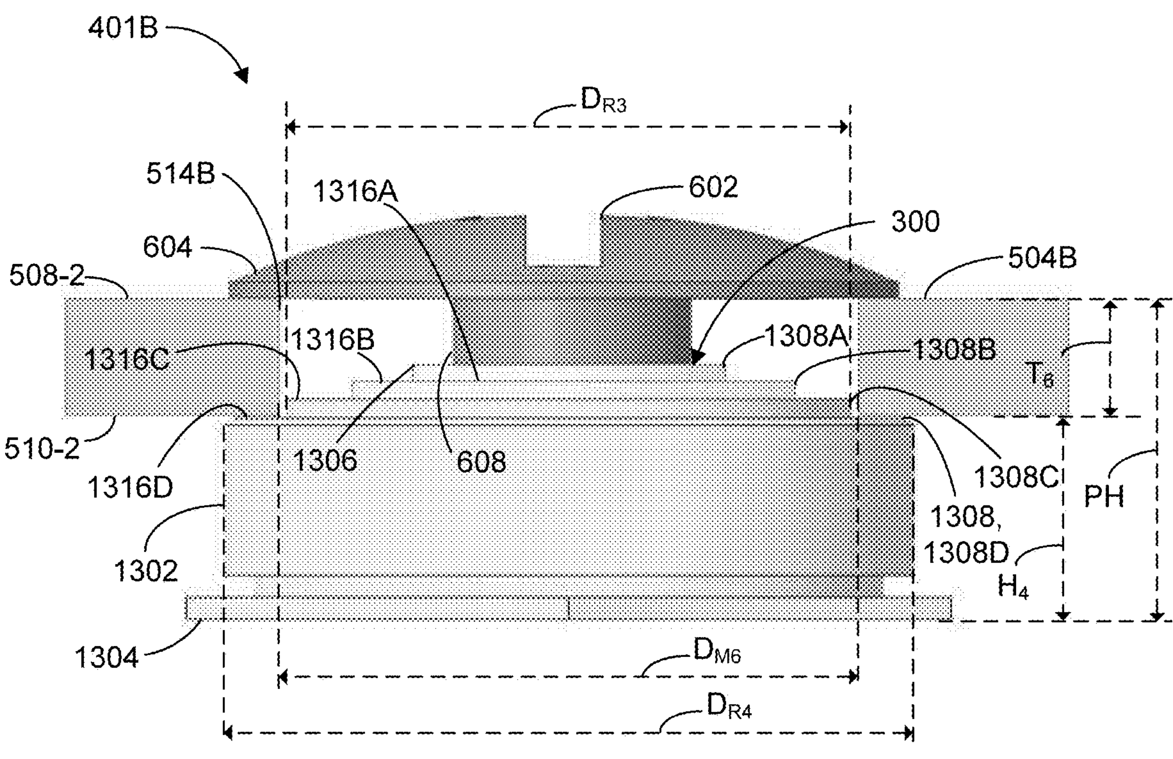
FIG. 4B includes a block diagram of a portion of another information processing device having a sixth printed circuit board and the third mounting system including the cylindrical standoff and the fastener according to an example of the present disclosure.

The multi-tiered shoulders 108 are formed between the first and second ends 104, 106. In the example of FIG. 1, the multi-tiered shoulders 108 includes two shoulders, e.g., a first shoulder 108A and a second shoulder 108B. However, in other examples disclosed herein, a variation of the cylindrical standoff 102 may have more than two multi-tiered shoulders, which may be similar to the multi-tiered shoulders 108. For example, FIGS. 4A and 4B illustrate an example standoff having four such shoulders. This also extends to other examples of similar standoffs having any other number of multi-tiered shoulders, such as three, five, or more shoulders. In some examples, each shoulder of the multi-tiered shoulders 108 may have a circular cross-section. In other examples, each shoulder 108 has an elliptical cross-section. In other examples, each shoulder has a square cross-section. Further, each shoulder 108 includes an upwardly facing mounting face 116. For example, the first shoulder 108A includes a first mounting face 116A and the second shoulder 108B includes a second mounting face 116B. The respective mounting faces 116 of the shoulders 108 have different heights and different outer diameters (or radii).

For example, the heights of the shoulders 108 (measured from the first end 104 to the mounting face 116 of the shoulder 108) decrease with each successive shoulder 108 from the second end 106 to the first end 104. In the example of FIG. 1, the first shoulder 108A has a first height $H_1$ from the first end 104 to the first mounting face 116A. In this example, the first mounting face 116A is also the second end 106, and therefore the height $H_1$ of the first shoulder 108A is the same as the height $H_1$ of the overall standoff 102. The second shoulder 108B has a second height $H_2$ from the first end 104 to the second mounting face 116B. The second height $H_2$ is smaller than the first height $H_1$. Hence, the height of the shoulders 108 decreases with each successive shoulder from the second end 106 towards the first end 104.

Conversely, diameters of the shoulders 108 (measured between two diametrically opposite points on the outermost radial surface of the shoulder 108) or the radii of the shoulders 108 (measured from the central axis C to the outermost radial surface of the shoulder 108) increase with each successive shoulder from the second end 106 to the first end 104. For example, the first shoulder 108A has a first outer diameter $D_{R1}$ measured between two diametrically opposite points on the outermost radial surface of the first shoulder 108A. Similarly, the second shoulder 108B has a second outer diameter $D_{R2}$ measured between two diametrically opposite points on the outermost radial surface of the second shoulder 108B. The first outer diameter $D_{R1}$ is smaller than the second outer diameter $D_{R2}$. Hence, the outer diameter (or radius) of the first and second shoulders 108A, 108B increases with each successive shoulder from the second end 106 towards the first end 104. Further, the fastener hole 114 has a diameter $D_F$. In one or more examples, the diameter $D_F$ is smaller than the first and second outer diameters $D_{R1}$, $D_{R2}$, respectively.

In some examples, multi-tiered shoulders 108 may be configured to interchangeably receive respectively compatible printed circuit boards (PCBs) to mount the PCBs to the support structure. In some examples, the respective mounting faces 116 of the shoulders 108 have different heights and different outer radii relative to one another such that the shoulders 108 are respectively compatible with different ones of the PCBs having different PCB thicknesses and different mounting hole diameters. In one or more examples, the height of each shoulder 108 is set such that, in the mounted state of a compatible PCB on the shoulder 108, the height of a top face of the compatible PCB is at a predetermined height PH from the first end 104 of the cylindrical standoff 102. In such examples, the predetermined height is the same for each of the shoulders 108. In other words, notwithstanding two PCBs having different thicknesses, the cylindrical standoff 102 can hold those PCBs with their top face as the same predetermined height PH by mounting the different PCBs to different shoulders 108. This will be described in greater detail below in relation to FIGS. 3A-3D.

FIG. 2A depicts a fastener 202 of the first mounting system 100. The fastener 202 may be a retention element configured to secure the mounted component (e.g., PCB) to the cylindrical standoff 102. The fastener 202 includes a head section 204 and a body section 206.

The head section 204 includes a driver slot 205 which may be engaged with a fastener driver (not shown) to rotate the fastener 202. The body section 206 includes a shank portion 208 and the threaded portion 210. The shank portion 208 is a cylindrical un-threaded portion connected to the head section 204. The threaded portion 210 having counter threads 212, extends from the shank portion 208. The shank portion 208 has a fixed length L and a first diameter $D_1$.

In some examples, the first diameter $D_1$ is greater than each of a second diameter $D_2$ of the threaded portion 210 of the fastener 202 and a diameter $D_F$ of the fastener hole 114 of the cylindrical standoff 102 (as shown in FIG. 1). The reason for setting $D_1 > D_F$ is to ensure that the fastener 202 cannot be over tightened. When the fastener 202 has been driven a predetermined distance into the fastener hole 114, the shank portion 208 contacts the first mounting face 116A and prevents the fastener 202 from being advanced any farther into the fastener hole 114. Upon the shank portion 208 contacting the first mounting face 116A and stopping advancement of the fastener 202, the bottom surface of the head section 204 may be located precisely a distance D (equal to the length L of the shank portion 208) from the first mounting face 116A. In some examples, this length L of the shank portion 208 is set to be substantially equal to a thickness of a PCB which is designed for mounting to the first shoulder 108A (e.g., thickness $T_1$ of first PCB 304A of FIG. 3A) so that, when the fastener 202 is fully tightened, the PCB fits tightly between the head section 204 and the first mounting face 116A (in some cases, without substantial play and without substantial deformation of the PCB). In contrast, if the fastener were allowed to be driven any desired distance, the fastener may be overdriven to a point where the distance between the head section 204 and the first mounting face 116A is substantially less than the thickness of the PCB, which may result in the fastener crushing or tearing through the PCB.

Further, the first diameter $D_1$ is smaller than an outer diameter of a foremost shoulder e.g., the first diameter $D_{R1}$ of the first shoulder 108A of the multi-tiered shoulders 108 at the second end 106. More specifically, the first diameter $D_1$ may be smaller than a diameter (e.g., a first mounting hole diameter $D_{M1}$ in FIG. 3A) of a mounting hole of a PCB which is designed to mount to the first shoulder 108A. This may allow the shank portion 208 to fit through the mounting hole.

The head section 204 has a third diameter $D_3$. In one or more examples, the third diameter $D_3$ exceeds the mounting hole diameter of the largest PCB mounting holes of any of the compatible PCBs, to ensure that the fastener 202 can hold the PCB without slipping through the PCB mounting hole. In particular, the third diameter $D_3$ is greater than the second mounting hole diameter $D_{M2}$ of the second mounting hole 314B (e.g., the largest PCB mounting hole in FIG. 3B), and therefore the head section 204 of the fastener 202 engages with the PCB to hold the PCB without slipping through the largest PCB mounting hole of the PCB.

The fastener 202 may be driven by the fastener driver to extend through a mounting hole 314 of a given PCB 304 (as shown in FIGS. 3A-3D) and into the fastener hole 114 of the cylindrical standoff 102 and engage the given PCB 304 to the cylindrical standoff 102 so as to releasably attach the given PCB 304 to the support structure 302.

FIG. 2B depicts an alternative fastener 252 of a mounting system 200. As noted above, the mounting system 200 also includes the cylindrical standoff 102 of FIG. 1. The fastener 252 may be a retention element configured to secure the mounted component (e.g., PCB) to the cylindrical standoff 102. The fastener 252 includes a head section 254 and a body section 256.

The head section 254 includes a driver slot 255 which may be engaged with a fastener driver (not shown) to rotate the fastener 252. The body section 256 includes counter threads 262, connected to the head section 254. The fastener 252 may be driven by the fastener driver to extend through a mounting hole of a PCB (such as mounting holes 414A or 414B of the PCBs 404A or 404B as shown in FIGS. 3C-3D) and into the fastener hole 114 of the cylindrical standoff 102 (as shown in FIG. 1) and attach the PCB to the cylindrical standoff 102 so as to releasably attach the PCB to a support structure 302.

Like the fastener 202, in the fastener 252 a fourth diameter $D_4$ of the head section 254 is greater than a largest mounting hole diameter out of the mounting hole diameters of the PCBs which are compatible with the mounting system 200. For instance, in the example of FIGS. 3C and 3D, the largest mounting hole diameter is a second mounting hole diameter $D_{M4}$ of a fourth mounting hole 414B, and therefore the fourth diameter $D_4$ of the head section 254 of fastener 252 may exceed the second mounting hole diameter $D_{M4}$. Since, the fourth diameter $D_4$ is greater than the second mounting hole diameter $D_{M4}$ of the fourth mounting hole 414B (e.g., the largest PCB mounting hole in FIG. 3D), the fastener 252 engages with the PCB to hold the PCB without slipping through the largest PCB mounting hole of the PCB. In some examples, the fourth diameter $D_4$ of the head section 254 is equal to the third diameter $D_3$ of the head section 204 of the fastener 202.

Unlike the fastener 202, the fastener 252 does not include the shank portion 208 which has a diameter that exceeds the diameter $D_F$ of the fastener hole 114. In some examples, the fastener 252 does not have any shank portion at all and includes counter threads 262 from the bottom of the head section 254 to the tip of the body section 256. In other examples (not illustrated), the fastener 252 does include a shank portion that lacks threads which is situated between the head section 254 and the body section 256, but in these cases the shank portion may have a similar diameter as the body section 256 so that it does not contact the first mounting face 116A when the fastener 252 is installed in the fastener hole 114.

The mounting systems 100 and 200 described above can be used to mount different PCBs having different thicknesses to a support structure while maintaining a height of a top face of the PCBs at the same predetermined position notwithstanding the differences in thickness. FIGS. 3A-3D illustrate some examples of how this can be achieved. FIGS. 3A and 3B illustrate the first mounting system 100 being used to mount two PCBs 304A and 304B having different thickness to a support structure 302, while FIGS. 3C and 3D illustrate the second mounting system 200 being used to mount two PCBs 404A and 404B having different thickness to the support structure 402.

FIG. 3A depicts a cross-section of a portion of an information processing device 301A having a support structure 302, the first mounting system 100 including the cylindrical standoff 102 of FIG. 1 and the fastener 202 of FIG. 2A, and a first printed circuit board (PCB) 304A.

In some examples, the information processing device 301A is a server, networking device, or other information processing device. In some examples, the support structure 302 is part of a chassis (e.g., a base or a motherboard tray) and the first PCB 304A is a primary system board e.g., a motherboard. In other examples, the support structure 302 is a riser cage bracket and the PCB 304 is a riser card.

The support structure 302 may be a sheet metal structure. In some examples, the support structure 302 includes a hole 303 configured to receive the cylindrical standoff 102. The hole 303 may include a rim portion 306 configured to engage with the cylindrical standoff 102 of the first mounting system 100 to couple the first mounting system 100 to the information processing device 301A. Specifically, the rim portion 306 extends into the engagement groove 110 so that it is held between the lip 107 and the shoulder 108.

In some examples, the cylindrical standoff 102 may be press fit into the hole 303. Although portions of the standoff have diameters greater than that of the hole 303, in some examples the cylindrical standoff 102 may nevertheless be capable of fitting through the hole 303 during a press-fit operation because they may deform the rim portion 306 temporarily to allow for passage and then the rim portion 306 may snap back into its nominal resting position when it reaches the engagement groove 110.

In other examples, the lip 107 is formed after, or during the process of the cylindrical standoff 102 being inserted into the hole 303. For instance, the material which will eventually form the lip 107 may initially have a different shape in the standoff such that the diameter of the bottom end of the cylindrical standoff 102 is similar to or smaller than the diameter of the hole 303, thus allowing the bottom portion of the cylindrical standoff 102 to be inserted through the hole 303. Then, after insertion through the hole 303, this material at the bottom end may be deformed in a manner similar to a rivet so that the material expands and/or moves into the shape of the lip 107, thus locking the rim portion 306 between the lip and the rest of the standoff.

In still other examples, a portion of the standoff which includes the lip 107 may be formed separate from the remainder of the standoff and may be attached to the rest of the cylindrical standoff 102 during the process of attaching the standoff to the support structure 302. For instance, the lip 107 may be positioned on one side of the support structure 302 and the remainder of the standoff may be positioned on the other side of the support structure 302 (except, in some examples, for a small portion which may extend through the hole 303). Then these two parts of the standoff may be joined together with the rim portion 306 of the support structure 302 being clamped therebetween. The joining of the lip 107 to the remainder of the cylindrical standoff 102 may be achieved by threads, welding, adhesives, friction/press fitting, or any other joining method.

The first PCB 304A (or a given PCB) has a top face 308-1 and a bottom face 310-1 opposite to the top face 308-1. The first PCB 304A has a first thickness $T_1$ defined by a substrate material of the first PCB 304A between the top and bottom faces 308-1, 310-1. The first PCB 304A further includes a first mounting hole 314A extending through the first thickness $T_1$. The first mounting hole 314A has a first mounting hole diameter $D_{M1}$. In the example of FIG. 3A, the first mounting hole diameter $D_{M1}$ is greater than a first diameter $D_1$ of the shank portion 208 and is smaller than a first outer diameter $D_{R1}$ of the first shoulder 108A. This allows the first PCB 304A to rest upon the first mounting face 116A without the first shoulder 108A slipping into the first mounting hole 314A, while also allowing the fastener 202 to extend through both the first mounting hole 314A and the fastener hole 114. Moreover, the third diameter $D_3$ (as labeled in FIG. 2A) of the head section 204 exceeds the first outer diameter $D_{R1}$ and the first mounting hole diameter $D_{M1}$, and therefore the head section 204 cannot pass through the first shoulder 308A and the first mounting hole 314A. Accordingly, the first PCB 304A is clamped between the head section 204 and the first mounting face 116A, thereby securing the first PCB 304A to the cylindrical standoff 102.

The cylindrical standoff 102 is disposed on the support structure 302 such that the first end 104 of the cylindrical standoff 102 contacts the support structure 302 and the rim portion 306 of the support structure 302 engages with the engagement groove 110 of the cylindrical standoff 102 to couple the first mounting system 100 to the information processing device 301A. In some other examples, the support structure 302 and the cylindrical standoff 102 may be manufactured as one single component. In some other examples, the support structure 302 and the cylindrical standoff 102 are integrated or joined to one another such that a unitary mounting and supporting structure is formed therefrom.

Further, the cylindrical standoff 102 receives the first PCB 304A so as to allow the bottom face 310-1 of the first PCB 304A to be mounted on the mounting face 116 of one shoulder of the multi-tiered shoulders 108. In other words, the first PCB 304A may be disposed through the second end 106 of the cylindrical standoff 102. In such examples, the first shoulder 108A having the first outer diameter $D_{R1}$ greater than the first mounting hole diameter $D_{M1}$ of the first PCB 304A may restrict the first PCB 304A to move beyond the first shoulder 108A and allow the bottom face 310-1 of the first PCB 304A to seat on the first mounting face 116A of the first shoulder 108A. In some examples, the first height $H_1$ of the first shoulder 108A is set such that, in the mounted state of the first PCB 304A on the first shoulder 108A, the top face 308-1 of the first PCB 304A is at a predetermined height PH from the first end 104 of the cylindrical standoff 102. In other words, the height of the compatible shoulder 108A on which the first PCB 304A is seated, and the first thickness $T_1$ of the first PCB 304A may be set to sum up to the predetermined height PH from the first end 104 of the cylindrical standoff 102. The predetermined height PH being the same for each of the shoulders 108. Thus, the cylindrical standoff 102 may maintain the predetermined height PH regardless of differences in PCB thickness.

The fastener 202 is disposed on the first PCB 304A such that the threaded portion 210 is aligned with the first mounting hole 314A of the first PCB 304A and the fastener hole 114 of the cylindrical standoff 102. Further, the fastener 202 is driven such that the threaded portion 210 extends or travels through the first mounting hole 314A of the first PCB 304A and into the fastener hole 114 of the cylindrical standoff 102 and the head section 204 engages with the top face 308-1 of the first PCB 304A to releasably attach the first PCB 304A to the support structure 302. In particular, as the threaded portion 210 of the fastener 202 extends into the fastener hole 114, the counter threads 212 in the threaded portion 210 engages with the threads 112 in the fastener hole 114 and the head section 204 contacts the top face 308-1 of the first PCB 304A to secure the first PCB 304A to the support structure 302. In such examples, the shank portion 208 of the fastener 202 engages with the first mounting face 116A of the foremost shoulder or the first shoulder 108A to prevent further travelling of the head section 204 beyond a predetermined position and crushing of the first PCB 304A between the fastener 202 and the cylindrical standoff 102.

FIG. 3B depicts a cross-section of a portion of an information processing device 301B having the support structure 302, the first mounting system 100 including the cylindrical standoff 102 of FIG. 1 and the fastener 202 of FIG. 2A, and a second printed circuit board (PCB) 304B. The device 301B may be identical to the device 301A described above except that the second PCB 304B is used instead of the first PCB 304A.

The second PCB 304B (or a given PCB) has a top face 308-2 and a bottom face 310-2 opposite to the top face 308-2. The second PCB 304B has a second thickness $T_2$ defined by a substrate material of the second PCB 304B between the top and bottom faces 308-2, 310-2. The second thickness $T_2$ is greater than the first thickness $T_1$ (as shown in FIG. 3A). In some examples, the first thickness $T_1$ is about 1.57 mm and the second thickness $T_2$ is about 1.93 mm. The second PCB 304B further includes a mounting hole 314, e.g., a second mounting hole 314B extending through the second thickness $T_2$. The second mounting hole 314B has a second mounting hole diameter $D_{M2}$. In the example of FIG. 3B, the second mounting hole diameter $D_{M2}$ is greater than a first outer diameter $D_{R1}$ of the first mounting face 116A of the first shoulder 108A and is smaller than the second outer diameter $D_{R2}$ of the second mounting face 116B of the second shoulder 108B. This allows the second PCB 304B to slip through the first shoulder 108A and rest upon the second mounting face 116B of the second shoulder 108B, while also allowing the fastener 202 to extend through both the second mounting hole 314B and the fastener hole 114. Moreover, the third diameter $D_3$ (as labeled in FIG. 2A) of the head section 204 exceeds the second outer diameter $D_{R2}$ and the second mounting hole diameter $D_{M2}$, and therefore the head section 204 cannot pass through the second shoulder 308B and the second mounting hole 314B. Accordingly, the second PCB 304B is clamped between the head section 204 and the second mounting face 116B, thereby securing the second PCB 304B to the cylindrical standoff 102.

The cylindrical standoff 102 is coupled to the support structure 302 similar to the cylindrical standoff 102 been coupled to the support structure 302, as discussed hereinabove in the example of FIG. 3A. Further, the cylindrical standoff 102 receives the second PCB 304B so as to allow the bottom face 310-2 of the second PCB 304B to be mounted on the mounting face 116 of one of the multi-tiered shoulders 108. In such examples, the first shoulder 108A having the first outer diameter $D_{R1}$ smaller than the second mounting hole diameter $D_{M2}$ of the second PCB 304B allows the second PCB 304B to slip through the first shoulder 108A. However, the second shoulder 108B having the second outer diameter $D_{R2}$ greater than the second mounting hole diameter $D_{M2}$ of the second PCB 304B restricts the second PCB 304B to move beyond the second shoulder 108B and allows the bottom face 310-2 of the second PCB 304B to seat on the second mounting face 116B of the second shoulder 108B. In some examples, the second height $H_2$ of the second shoulder 108B is set such that, in the mounted state of the second PCB 304B on the second shoulder 108B, the top face 308-2 of the second PCB 304B is at a predetermined height PH from the first end 104 of the cylindrical standoff 102. In other words, the second height $H_2$ of the second shoulder 106B and the second thickness $T_2$ of the second PCB 304B may be set to sum up to the predetermined height PH from the first end 104 of the cylindrical standoff 102.

The fastener 202 is disposed on the second PCB 304B such that the threaded portion 210 is aligned with the second mounting hole 314B of the second PCB 304B and the fastener hole 114 of the cylindrical standoff 102. Further, the fastener 202 is driven such that the threaded portion 210 extends or travels through the second mounting hole 314B of the second PCB 304B and into the fastener hole 114 of the cylindrical standoff 102, and the head section 204 engages with the top face 308-2 of the second PCB 304B to releasably attach the second PCB 304B to the support structure 302. In particular, as the threaded portion 210 of the fastener 202 extends into the fastener hole 114, the counter threads 212 in the threaded portion 210 engages with the threads 112 in the fastener hole 114 and the head section 204 contacts the top face 308-2 of the second PCB 304B to secure the second PCB 304B to the support structure 302. In such examples, the shank portion 208 of the fastener 202 engages with the first mounting face 116A of the foremost shoulder or the first shoulder 108A to prevent further travelling of the head section 204 beyond a predetermined position and crushing of the second PCB 304B between the fastener 202 and the cylindrical standoff 102.

In one or more examples, the mounting hole diameter (or radius) of the compatible PCB is greater than the outer diameter (or radius) of a next higher shoulder so as to allow the higher shoulder to pass through the mounting hole of the compatible PCB. For example, the second mounting hole diameter $D_{M2}$ of the second PCB 304B is greater than the first outer diameter $D_{R1}$ of the first shoulder 108A so as to allow the first shoulder 108A to pass through the second mounting hole 314B of the second PCB 304B.

FIG. 3C depicts a cross-section of a portion of an information processing device 301C having a support structure 402, the second mounting system 200 including the cylindrical standoff 102 of FIG. 1 and the fastener 252 of FIG. 2B, and a third printed circuit board (PCB) 404A. The device 301C may be identical to the device 301A described above except that the fastener 252 is used instead of the fastener 202.

The support structure 402 may be similar to the support structure 302 discussed hereinabove in the example of FIG. 3A. Furthermore, the third PCB 404A may also be similar to the first PCB 304A discussed hereinabove in the example of FIG. 3A. For example, the third PCB 404A has a top face 408-1 and a bottom face 410-1. The third PCB 404A has a third thickness $T_3$ which may be equal to the first thickness $T_1$ of the first PCB 304A. The third PCB 404A further includes a third mounting hole 414A extending through the third thickness $T_3$ and having a third mounting hole diameter $D_{M3}$.

The cylindrical standoff 102 may be coupled to the support structure 402 as similar to the cylindrical standoff 102 been coupled to the support structure 302, discussed herein in the example of FIG. 3A. Further, the cylindrical standoff 102 receives the third PCB 404A so as to allow the bottom face 410-1 of the third PCB 404A to be mounted on the mounting face 116 of one shoulder of the multi-tiered shoulders 108. In such examples, the first shoulder 108A having the first outer diameter $D_{R1}$ greater than the third mounting hole diameter $D_{M3}$ of the third PCB 404A may restrict the third PCB 404A to move beyond the first shoulder 108A and allow the bottom face 410-1 of the third PCB 404A to seat on the first mounting face 116A of the first shoulder 108A. In some examples, the first height $H_1$ of the first shoulder 108A is set such that, in the mounted state of the third PCB 404A on the first shoulder 108A, the top face 408-1 of the third PCB 404A is at a predetermined height PH from the first end 104 of the cylindrical standoff 102. In other words, the height $H_1$ of the first shoulder 108A on which the third PCB 404A is seated, and the third thickness $T_3$ of the third PCB 404A may be set to sum up to the predetermined height PH from the first end 104 of the cylindrical standoff 102. The predetermined height PH being the same for each of the shoulders 108. Thus, the cylindrical standoff 102 may maintain the predetermined height PH regardless of differences in PCB thickness.

The fastener 252 is disposed on the third PCB 404A such that the body section 256 is aligned with the third mounting hole 414A of the third PCB 404A and the fastener hole 114 of the cylindrical standoff 102. Further, the fastener 252 is driven such that the body section 256 extends or travels through the third mounting hole 414A of the third PCB 404A and into the fastener hole 114 of the cylindrical standoff 102 and the head section 254 engages with the top face 408-1 of the third PCB 404A to releasably attach the third PCB 404A to the support structure 402. In particular, as the body section 256 of the fastener 252 extends into the fastener hole 114, the counter threads 262 in the threaded portion 260 engages with the threads 112 in the fastener hole 114 and the head section 254 contacts the top face 408-1 of the third PCB 404A to secure the third PCB 404A to the support structure 402. Since, the fourth diameter $D_4$ of the head section 254 is greater than the third mounting hole diameter $D_{M3}$, the head section 254 does not slip through the third mounting hole 314C and engages with the top face 408-1 of the third PCB 404A to secure the third PCB 404A to the support structure 402.

FIG. 3D depicts a cross-section of a portion of an information processing device 301D having the support structure 402, the second mounting system 200 including the cylindrical standoff 102 of FIG. 1 and the fastener 252 of FIG. 2B, and a fourth printed circuit board (PCB) 404B. The device 301D may be identical to the device 301B described above except that the fastener 252 is used instead of the fastener 202.

The support structure 402 may be similar to the support structure 302 discussed hereinabove in the example of FIG. 3A. Furthermore, the fourth PCB 404B may also be similar to the second PCB 304B discussed hereinabove in the example of FIG. 3B. For example, the fourth PCB 404B has a top face 408-2 and a bottom face 410-2. The fourth PCB 404B has a fourth thickness $T_4$ which may be equal to the second thickness $T_2$ of the second PCB 304B. The fourth PCB 404B further includes a fourth mounting hole 414B extending through the fourth thickness $T_4$ and having a fourth mounting hole diameter $D_{M4}$.

The cylindrical standoff 102 may be coupled to the support structure 402 as similar to the cylindrical standoff 102 been coupled to the support structure 302, discussed herein in the example of FIG. 3A. Further, the cylindrical standoff 102 receives the fourth PCB 404B so as to allow the bottom face 410-2 of the fourth PCB 404B to be mounted on the mounting face 116 of one of the multi-tiered shoulders 108. In such examples, the first shoulder 108A having the first outer diameter $D_{R1}$ (as labeled in FIG. 3C) smaller than the third mounting hole diameter $D_{M3}$ of the third PCB 404A allows the fourth PCB 404B to slip through the first shoulder 108A. However, the second shoulder 108B having the second outer diameter $D_{R2}$ greater than the fourth mounting hole diameter $D_{M4}$ of the fourth PCB 404B restricts the fourth PCB 404B to move beyond the second shoulder 108B and allows the bottom face 410-2 of the fourth PCB 404B to seat on the second mounting face 116B of the second shoulder 108B. In some examples, the second height $H_2$ of the second shoulder 108B is set such that, in the mounted state of the fourth PCB 404B on the second shoulder 108B, the top face 408-2 of the fourth PCB 404B is at a predetermined height PH from the first end 104 of the cylindrical standoff 102. In other words, the second height $H_2$ of the second shoulder 106B and the fourth thickness $T_4$ of the fourth PCB 404B may be set to sum up to the predetermined height PH from the first end 104 of the cylindrical standoff 102.

The fastener 252 is disposed on the fourth PCB 404B such that the body section 256 is aligned with the fourth mounting hole 414B of the fourth PCB 404B and the fastener hole 114 of the cylindrical standoff 102. Further, the fastener 252 is driven such that the body section 256 extends or travels through the fourth mounting hole 414B of the fourth PCB 404B and into the fastener hole 114 of the cylindrical standoff 102, and the head section 254 engages with the top face 408-2 of the fourth PCB 404B to releasably attach the fourth PCB 404B to the support structure 402. In particular, as the body section 256 of the fastener 252 extends into the fastener hole 114, the counter threads 262 in the threaded portion 260 engages with the threads 112 in the fastener hole 114 and the head section 254 contacts the top face 408-2 of the fourth PCB 404B to secure the fourth PCB 404B to the support structure 402. Since, the fourth diameter $D_4$ of the head section 254 is greater than the fourth mounting hole diameter $D_{M4}$, the head section 254 does not slip through the fourth mounting hole 414B and engages with the top face 408-2 of the fourth PCB 404B to secure the fourth PCB 404B to the support structure 402.

FIG. 4A depicts a block diagram of a portion of an information processing device 401A having a fifth printed circuit board (PCB) 504A and a mounting system 300. It may be noted herein that a support structure of the information processing device 401A is not shown in the example of FIG. 4A for ease of illustration only.

The mounting system 300 includes a cylindrical standoff 1302 and a fastener 602. The cylindrical standoff 1302 is substantially similar to the cylindrical standoff 102, as discussed hereinabove in the example of FIG. 1 except that the cylindrical standoff 1302 includes four multi-tiered shoulders 1308 formed between first and second ends 1304, 1306.

More particularly, the cylindrical standoff 1302 includes first and second shoulders 1308A and 1308B which may be arranged similarly to the first and second shoulders 108A, 108B in the cylindrical standoff 102, and in addition the cylindrical standoff 1302 further comprises a third shoulder 1308C formed in a tier below the second shoulder 1308B and a fourth shoulder 1308D formed in a tier below the third shoulder 1308C. In one or more examples, the third shoulder 1308C has a third height $H_3$ from the first end 1304 to a third mounting face 1316C of the third shoulder 1308C. In such examples, the third height $H_3$ is smaller than the second height $H_2$ (as shown in FIGS. 3B, 3D). Further, the third shoulder 1308C has a third outer diameter $D_{R3}$ measured between two diametrically opposite points on the outermost radial surface of the third shoulder 1308C. In such examples, the third outer diameter $D_{R3}$ of the third shoulder 1308C is greater than the second outer diameter $D_{R2}$ of the second shoulder 1308B.

The fifth PCB 504A may be similar to the first PCB 304A discussed hereinabove in the example of FIG. 3A. For example, the fifth PCB 504A has a top face 508-1 and a bottom face 510-1. The fifth PCB 504A has a fifth thickness $T_5$. The fifth thickness Ts is greater than the second thickness $T_2$ of the second PCB 304B (as shown in FIG. 3B) and the fourth thickness $T_4$ of the fourth PCB 404B. The fifth PCB 504A further includes a fifth mounting hole 514A extending through the fifth thickness $T_5$. The fifth mounting hole 514A has a fifth mounting hole diameter $D_{M5}$. In the example of FIG. 4A, the fifth mounting hole diameter $D_{M5}$ is greater than a second outer diameter $D_{R2}$ of the second mounting face 1316B of the second shoulder 1308B and is smaller than the third outer diameter $D_{R3}$ of the third mounting face 1316C of the third shoulder 1308C. Further, the fifth mounting hole diameter $D_{M5}$ is greater than a second mounting hole diameter $D_{M2}$ (as shown in FIG. 3B) of the second PCB 304B and a fourth mounting hole diameter $D_{M4}$ (as shown in FIG. 3D) of the fourth PCB 404B.

The cylindrical standoff 1302 receives the fifth PCB 504A so as to allow the bottom face 510-1 of the fifth PCB 504A to be mounted on the mounting face 1316 of one of the multi-tiered shoulders 1308. In such examples, the second shoulder 1308B having the second outer diameter $D_{R2}$ smaller than the fifth mounting hole diameter $D_{M5}$ of the fifth PCB 504A allows the fifth PCB 504A to slip through the first and second shoulders 1308A, 1308B. However, the third shoulder 1308C having the third outer diameter $D_{R3}$ greater than the fifth mounting hole diameter $D_{M5}$ of the fifth PCB 504A restricts the fifth PCB 504A to move beyond the third shoulder 1308C and allows the bottom face 510-1 of the fifth PCB 504A to seat on the third mounting face 1316C of the third shoulder 1308C. In some examples, the third height $H_3$ of the third shoulder 1308C is set such that in the mounted state of the fifth PCB 504A on the third shoulder 1308C, the top face 508-1 of the fifth PCB 504A is at a predetermined height PH from the first end 1304 of the cylindrical standoff 1302. In other words, the third height $H_3$ of the third shoulder 1306C and the fifth thickness Ts of the fifth PCB 504A may be set to sum up to the predetermined height PH from the first end 1304 of the cylindrical standoff 1302.

The fastener 602 is substantially similar to the fastener 202, as discussed hereinabove in the example of FIG. 2A. The fastener 602 is disposed on the fifth PCB 504A such that a threaded portion (as shown in FIG. 2A) is aligned with the fifth mounting hole 514A of the fifth PCB 504A and a fastener hole (as shown in FIG. 1) of the cylindrical standoff 1302. Further, the fastener 602 is driven such that the threaded portion extends or travels through the fifth mounting hole 514A of the fifth PCB 504A and into the fastener hole 1310 of the cylindrical standoff 1302, and the head section 604 engages with the top face 508-1 of the fifth PCB 504A to releasably attach the fifth PCB 504A to the support structure. In such examples, the shank portion 608 of the fastener 202 engages with the first mounting face 316A of the foremost shoulder or the first shoulder 1308A to prevent further travelling of the head section 604 beyond a predetermined position and crushing of the fifth PCB 504A between the fastener 602 and the cylindrical standoff 1302.

FIG. 4B depicts a block diagram of a portion of another information processing device 401B having a sixth printed circuit board (PCB) 504B and the mounting system 300. It may be noted herein that a support structure of the information processing device 401B is not shown in the example of FIG. 4B for ease of illustration only.

The mounting system 300 includes a cylindrical standoff 1302 and a fastener 602. The cylindrical standoff 1302 is substantially similar to the cylindrical standoff, as discussed hereinabove in the example of FIG. 4A. The cylindrical standoff 1302 further includes a fourth shoulder 1308D formed in a tier below the third shoulder 1308C. In one or more examples, the fourth shoulder 1308D has a fourth height $H_4$ from the first end 1304 to the fourth mounting face 1316D of the fourth shoulder 1308D. In such examples, the fourth height $H_4$ is smaller than the third height $H_3$ (as shown in FIG. 4A). Further, the fourth shoulder 1308D has a fourth outer diameter $D_{R4}$ measured between two diametrically opposite points on the outermost radial surface of the fourth shoulder 1308D. In such examples, the fourth outer diameter $D_{R4}$ of the fourth shoulder 1308D is greater than the third outer diameter $D_{R3}$ of the third shoulder 1308C.

The sixth PCB 504B may be similar to the second PCB 304B discussed hereinabove in the example of FIG. 3B. For example, the sixth PCB 504B (or a given PCB) has a top face 508-2 and a bottom face 510-2. The sixth PCB 504B has a sixth thickness $T_6$ defined by a substrate material of the sixth PCB 504B between the top and bottom faces 508-1, 510-2. The sixth thickness $T_6$ is greater than the fifth thickness $T_5$ (as shown in FIG. 4A). The sixth PCB 504B further includes a sixth mounting hole 514B extending through the sixth thickness $T_6$. The sixth mounting hole 514B has a sixth mounting hole diameter $D_{M6}$. In the example of FIG. 4B, the sixth mounting hole diameter $D_{M6}$ is greater than a third outer diameter $D_{R3}$ of the third mounting face 1316C of the third shoulder 1308C and is smaller than the fourth outer diameter $D_{R4}$ of the fourth mounting face 1316D of the fourth shoulder 1308D. Further, the sixth mounting hole diameter $D_{M6}$ is greater than a fifth mounting hole diameter $D_{M5}$ of the fifth mounting hole 514A.

The cylindrical standoff 1304 receives the sixth PCB 504B so as to allow the bottom face 510-2 of the sixth PCB 504B to be mounted on the mounting face 1316 of one of the multi-tiered shoulders 1308. In such examples, the third shoulder 1308C having the third outer diameter $D_{R3}$ smaller than the sixth mounting hole diameter $D_{M6}$ of the sixth PCB 504B allows the sixth PCB 504B to pass through the first, second, and third shoulders 1308A, 1308B, 1308C. However, the fourth shoulder 1308D having the fourth outer diameter $D_{R4}$ greater than the sixth mounting hole diameter $D_{M6}$ of the sixth PCB 504B restricts the sixth PCB 504B to move beyond the fourth shoulder 1308D and allows the bottom face 510-2 of the sixth PCB 504B to seat on the fourth mounting face 1316D of the fourth shoulder 1308D. In some examples, the fourth height $H_4$ of the fourth shoulder 1308D is set such that in the mounted state of the sixth PCB 504B on the fourth shoulder 1308D, the top face 508-2 of the sixth PCB 504B is at a predetermined height PH from the first end 1304 of the cylindrical standoff 1302. In other words, the fourth height $H_4$ of the fourth shoulder 1306D and the sixth thickness $T_6$ of the sixth PCB 504B may be set to sum up to the predetermined height PH from the first end 1304 of the cylindrical standoff 1302.

The fastener 602 is substantially similar to the fastener 202, as discussed hereinabove in the example of FIG. 2A. The fastener 602 is disposed on the sixth PCB 504B such that a threaded portion (as shown in FIG. 2A) is aligned with the sixth mounting hole 514B of the sixth PCB 504B and a fastener hole (as shown in FIG. 1) of the cylindrical standoff 1302. Further, the fastener 202 is driven such that the threaded portion extends or travels through the sixth mounting hole 514B of the sixth PCB 504B and into the fastener hole of the cylindrical standoff 1302, and the head section 604 engages with the top face 508-2 of the sixth PCB 504B to releasably attach the sixth PCB 504B to the support structure. In such examples, the shank portion 608 of the fastener 602 engages with the first mounting face 316A of the foremost shoulder or the first shoulder 1308A to prevent further travelling of the head section 604 beyond a predetermined position and crushing of the sixth PCB 504B between the fastener 602 and the cylindrical standoff 1302.

Figure 5A:
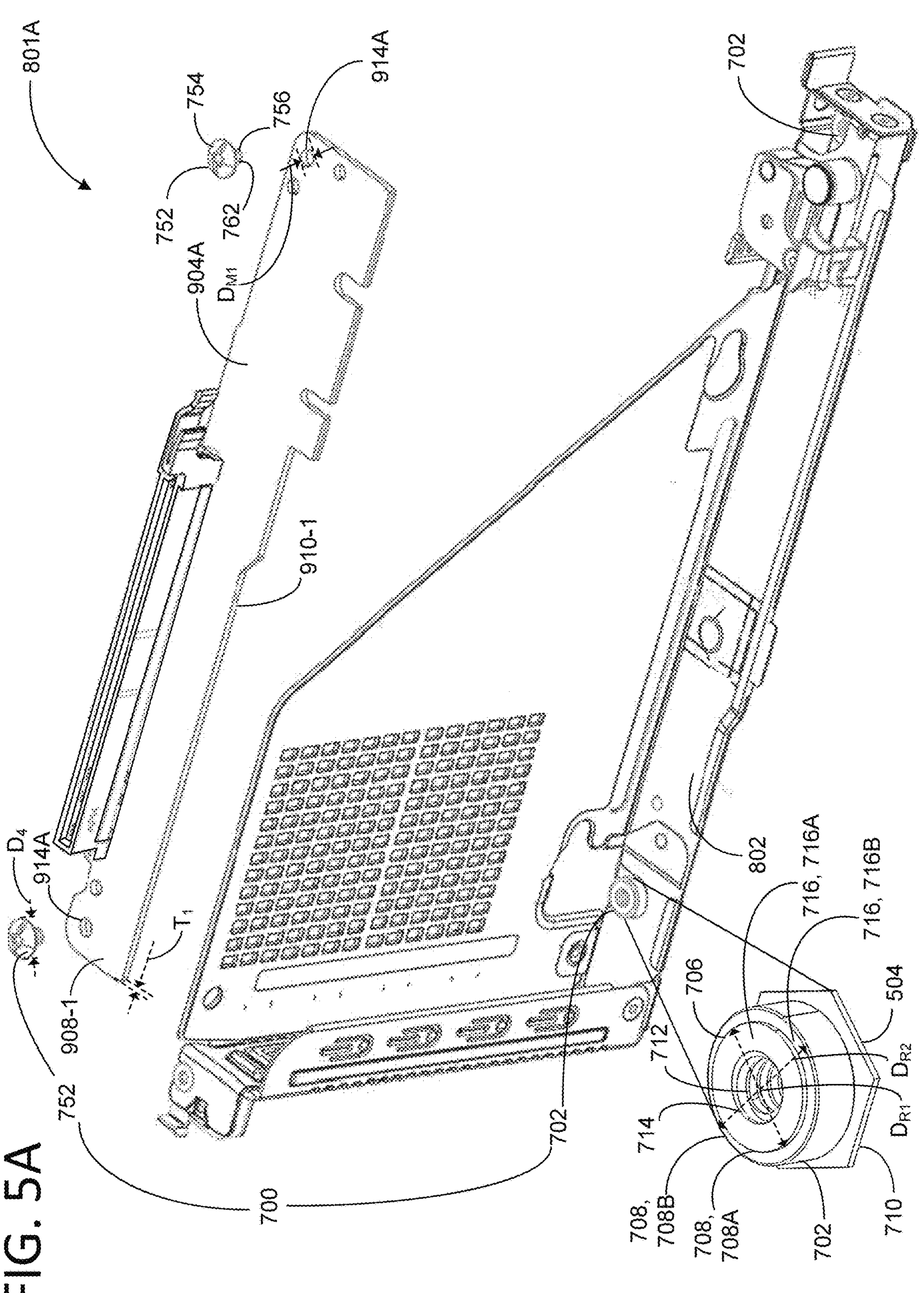
FIG. 5A includes an exploded perspective view of a riser assembly having a riser cage, a riser card, and a mounting system including a plurality of cylindrical standoffs and a plurality of fasteners according to an example of the present disclosure.
Figure 7:
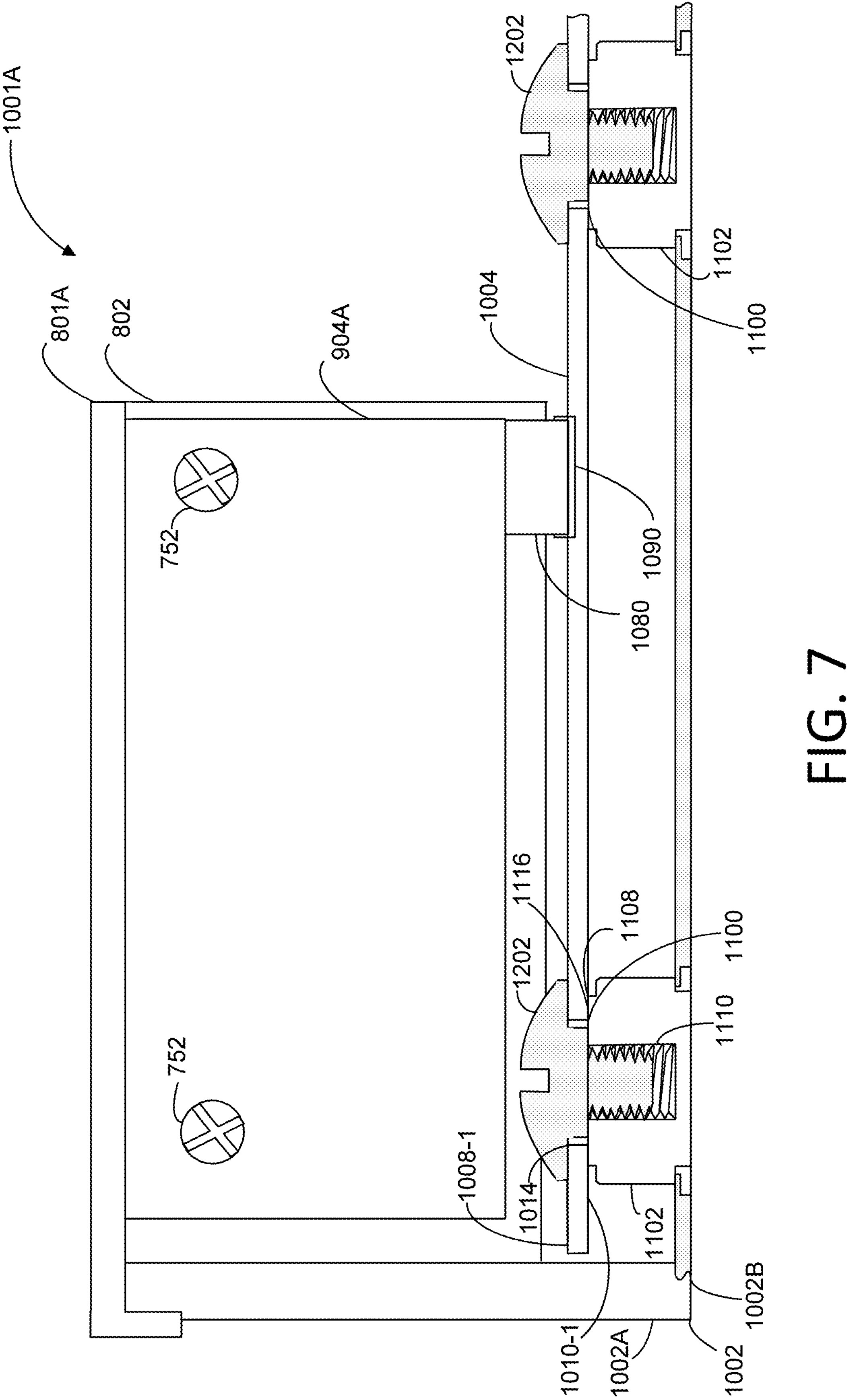
FIG. 7 includes a schematic diagram of an information processing device having a chassis, a primary system board, and a riser assembly according to an example of the present disclosure.

FIG. 5A depicts an exploded perspective view of a riser assembly 801A having a riser cage 802, a mounting system 700, and a riser card 904A. The riser cage 802 may be a sheet metal structure configured to support the riser card 904A and an expansion card (not shown) of an information processing device 1001A (as shown in FIG. 7). In some examples, the riser cage 802 may include a plurality of holes (not shown), each configured to couple the mounting system 700 e.g., a cylindrical standoff 702 of the mounting system 700 to the riser cage 802.

Figures 6A, 6B, 6C:
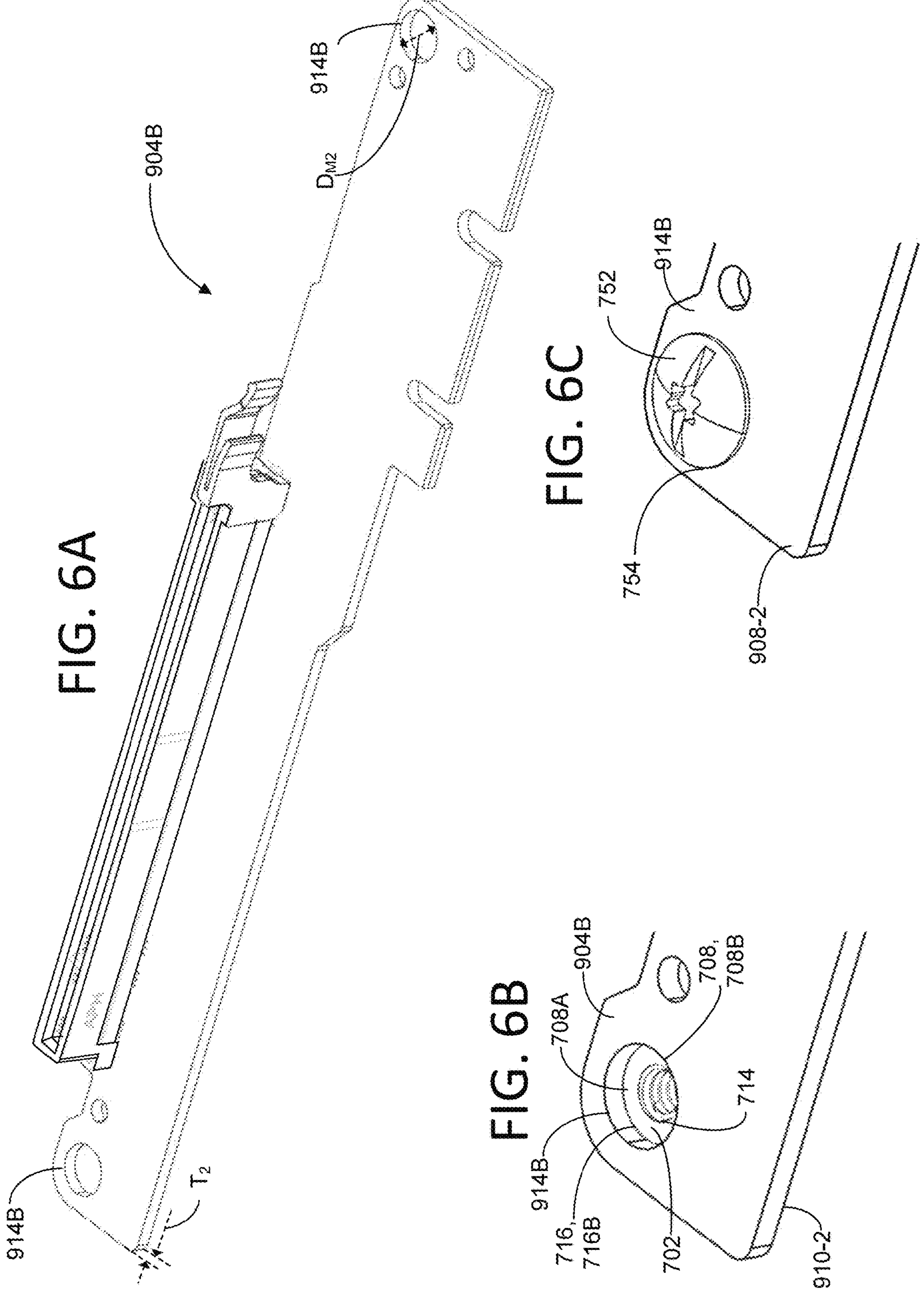
FIG. 6A includes a perspective view of a second riser card according to an example of the present disclosure.
FIG. 6B includes a perspective view of the second riser card of FIG. 6A mounted, but not yet attached to, on a cylindrical standoff according to an example of the present disclosure.
FIG. 6C includes a perspective view of a fastener releasably securing the second riser card of FIG. 6B to the cylindrical standoff according to an example of the present disclosure.

The mounting system 700 may be configured to secure the riser card 904A to the riser cage 802. In some examples, the mounting system 700 includes a plurality of cylindrical standoffs 702 and a fastener 752. Each cylindrical standoff 702 is substantially similar to the cylindrical standoff, as discussed hereinabove in the example of FIG. 1. Each cylindrical standoff 702 includes a first end 704 that may be coupled to the riser cage 802 and a second end 706 opposite to the first end 704 having a fastener hole 714. Each cylindrical standoff 702 further includes multi-tiered shoulders 708 formed between the first and second ends 704, 706. In some examples, each multi-tiered shoulder 708 includes a first shoulder 708A at the second end 706, and the second shoulder 708B below the first shoulder 708A. The first shoulder 708A has a first mounting face 716A and the second shoulder 708B has a second mounting face 716B, both facing the second end 706. In some examples, the multi-tiered shoulders 708 formed between the first and second ends 704, 706 is configured to interchangeably receive respectively compatible riser cards 904A, 904B (as shown in FIGS. 6A-6C). The fastener 752 includes a head portion 754 and a body portion 756. In some examples, the body portion 756 includes threads 762 extends from the head portion 754.

The riser card 904A (or a given PCB) has a top face 908-1 and a bottom face 910-1 opposite to the top face 908-1. The riser card 904A has a first thickness $T_1$ defined by a substrate material of the riser card 904A between the top and bottom faces 908-1, 910-1. The riser card 904-1 further includes first mounting holes 914A extending through the first thickness $T_1$. Each first mounting hole 914A has a first mounting hole diameter $D_{M1}$. In the example of FIG. 5A, the first mounting hole diameter $D_{M1}$ is smaller than a fourth diameter $D_4$ of the head portion 754 of the fastener 752 and is smaller than a first outer diameter $D_{R1}$ of the first mounting face 716A of the first shoulder 708A. Each standoff of the plurality of cylindrical standoffs 702 is disposed on the riser cage 802 and coupled to the riser cage 802, as discussed hereinabove in the example of FIG. 3A.

Figure 5B:
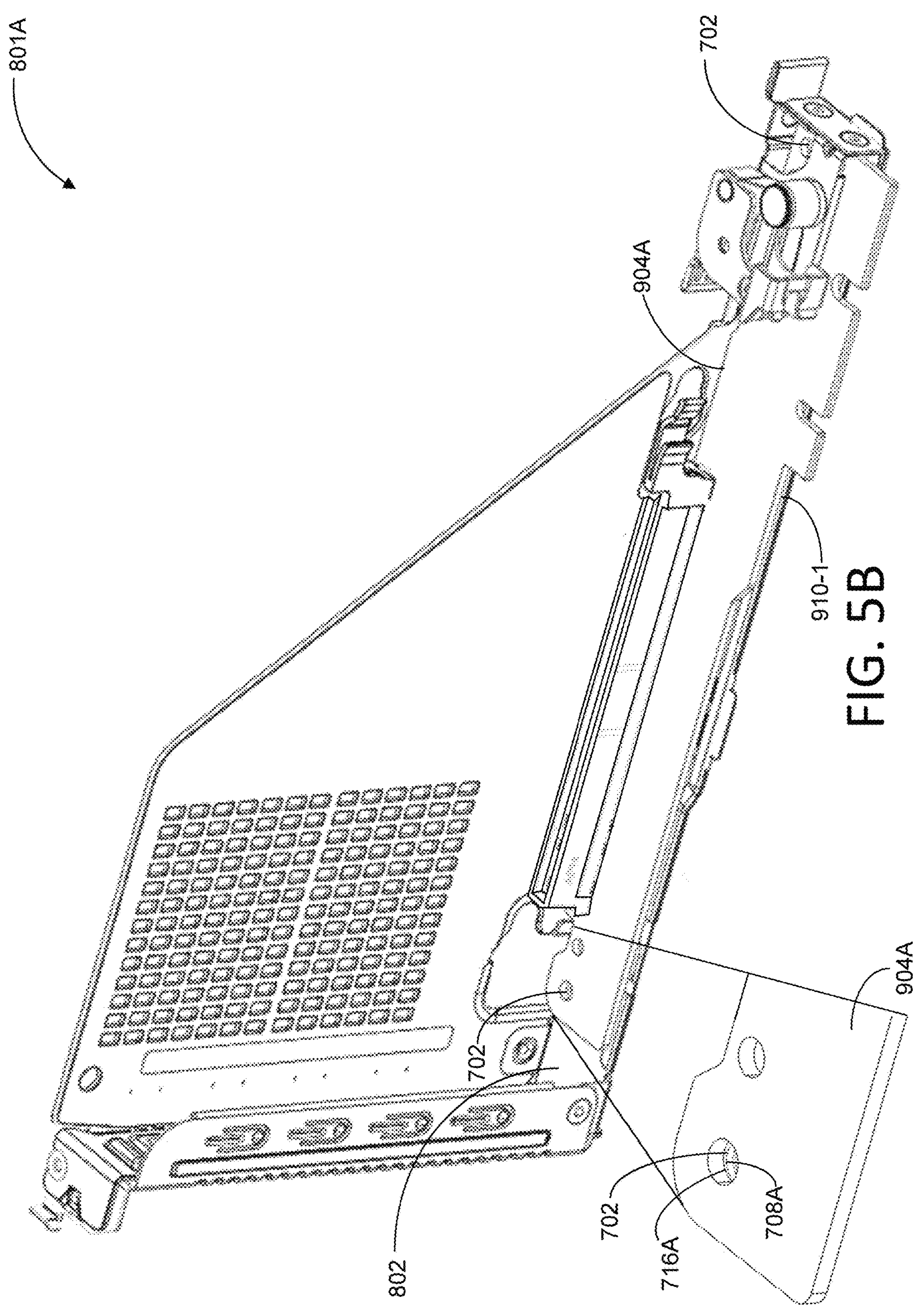
FIG. 5B includes a perspective view of the riser assembly of FIG. 5A in a first state of assembly in which the riser card is mounted on, but not yet attached to, the plurality of cylindrical standoffs according to an example of the present disclosure.

FIG. 5B depicts a perspective view of the riser assembly 801A of FIG. 5A in the first state of assembly in which the riser card 904A is mounted on, but not yet attached to, the plurality of cylindrical standoffs 502. The plurality of cylindrical standoffs 702 receives the riser card 904A so as to allow the bottom face 910-1 of the riser card 904A to be mounted on the mounting face 716 of one shoulder of the multi-tiered shoulders 708. In such examples, the first shoulder 708A of each cylindrical standoff 702 having the first outer diameter $D_{R1}$ (as shown in FIG. 5A) greater than the first mounting hole diameter $D_{M1}$ (as shown in FIG. 5A) of the riser card 904A may restrict the riser card 904A to move beyond the first shoulder 708A and allow the bottom face 910-1 of the riser card 904A to seat on the first mounting face 716A of the first shoulder 708A. In some examples, the first height of the first shoulder 708A is set such that, in the mounted state of the riser card 904A on the first shoulder 708A, the top face 908-1 of the riser card 904A is at a predetermined height from the first end 704 of each cylindrical standoff 702.

Figure 5C:
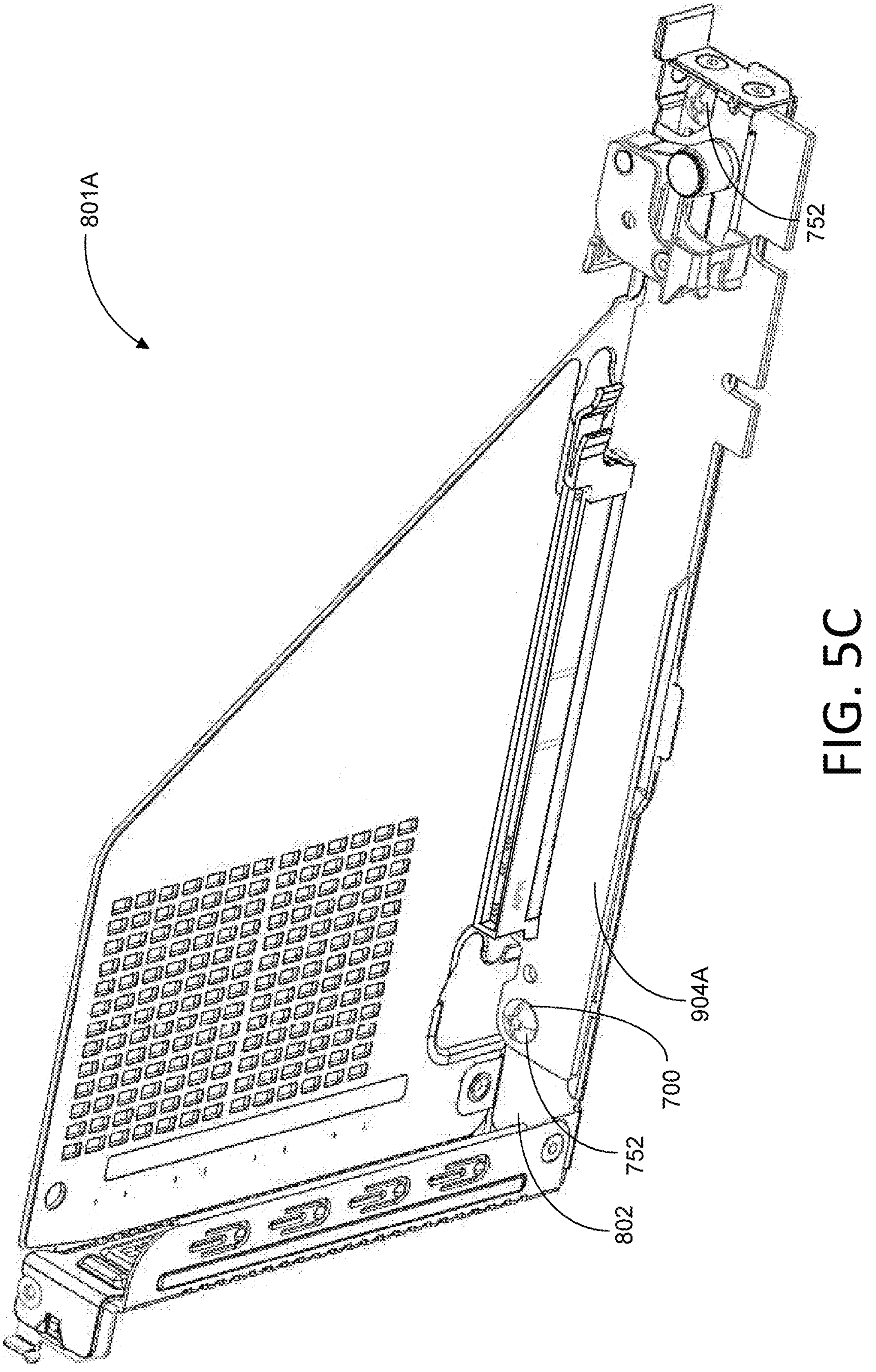
FIG. 5C includes a perspective view of the riser assembly of FIG. 5A in a second state of assembly in which the plurality of fasteners releasably secure the riser card to the riser cage according to an example of the present disclosure.

Referring to Figures, FIG. 5C depicts a perspective view of the riser assembly 801A of FIG. 5B in a second state of assembly in which the plurality of fasteners 752 releasably secures the riser card 904A to the riser cage 802. In some examples, after the riser card 904A is mounted on the first mounting face 716A (as shown in FIG. 5B) of each cylindrical standoff 702, the fastener 752 is disposed on the riser card 904A such that the body portion 756 (as shown in FIG. 5A) is aligned with the first mounting hole 914A (as shown in FIG. 5A) of the riser card 904A and the fastener hole 714 (as shown in FIG. 5A) of each cylindrical standoff 702. Further, the fastener 752 is driven such that the body portion 760 extends or travels through the first mounting hole 914A of the riser card 904A and into the fastener hole 714 of each cylindrical standoff 702 and the head portion 754 engages with the top face 908-1 of the riser card 904A to releasably attach the riser card 904A to the riser cage 802.

FIG. 6A depicts a perspective view of a second riser card 904B of a riser assembly (not shown). The second riser card 904B has a second thickness $T_2$ greater than the first thickness $T_1$ of the riser card 904A (as shown in FIGS. 5A-5C). In some examples, the first thickness $T_1$ is about 1.57 mm and the second thickness $T_2$ is about 1.93 mm. The second riser card 904B further includes second mounting holes 914B extending through the second thickness $T_2$. The second mounting hole 914B has a second mounting hole diameter $D_{M2}$. In the example of FIG. 6A, the second mounting hole diameter $D_{M2}$ is greater than a first outer diameter $D_{R1}$ (as shown in FIG. 5A) of the first mounting face 716A of the first shoulder 708A and is smaller than the second outer diameter $D_{R2}$ (as shown in FIG. 5A) of the second mounting face 716B of the second shoulder 708B (as shown in FIG. 5A).

FIG. 6B depicts a perspective view of the second riser card 904B of FIG. 6A mounted on a cylindrical standoff 702 (as shown in FIG. 5A). The cylindrical standoff 702 receives the second riser card 904B so as to allow a bottom face 910-2 of the second riser card 904B to be mounted on the mounting face 716 of one of the multi-tiered shoulders 708.

In such examples, the first shoulder 708A having the first outer diameter $D_{R1}$ smaller than the second mounting hole diameter $D_{M2}$ of the second riser card 904B allows the second riser card 904B to slip through the first shoulder 708A. However, the second shoulder 708B having the second outer diameter $D_{R2}$ greater than the second mounting hole diameter $D_{M2}$ of the second riser card 904B restricts the second riser card 904B to move beyond the second shoulder 708B and allows the bottom face 910-2 of the second riser card 904B to seat on the second mounting face 716B of the second shoulder 708B. After the second riser card 904B is mounted on the second mounting face 716B of each cylindrical standoff 702, the fastener 752 is disposed on the second riser card 904B such that a body portion (not shown) is aligned with the second mounting hole 914B of the second riser card 904B and the fastener hole 714 of each cylindrical standoff 702. In some examples, the respective mounting faces 716A, 716B of the shoulders 708A, 708B have different heights $H_1$, $H_2$ and different outer diameters relative $D_{R1}$, $D_{R2}$ to one another such that the shoulders 708A, 708B are respectively compatible with different ones of the riser cards 904A, 904B having different riser card thicknesses $T_1$, $T_2$, and different mounting hole diameters $D_{M1}$, $D_{M2}$.

Further, the fastener 752 is driven such that the body portion extends or travels through the second mounting hole 914B of the second riser card 904B and into the fastener hole 714 of each cylindrical standoff 702 and the head portion 754 engages with the top face 908-2 of the second riser card 904B to releasably attach the second riser card 904B to a riser cage.

FIG. 7 depicts a schematic diagram of an information processing device 1001A having a chassis 1002, a primary system board 1004, a riser assembly 801A of FIGS. 5A-5C, and a mounting system 1100. The chassis 1002 includes a sidewall 1002A and a base 1002B connected to each other. The base 1002B may include a plurality of coupling element (not labeled), as discussed in the example of FIG. 3A, each configured to couple the mounting system 1100 e.g., a cylindrical standoff 1102 of the mounting system 1100 to the chassis 1002. The primary system board 1004 is coupled to the base 1002B of the chassis 1002 via the mounting system 1100 as discussed in greater detail below. The primary system board 1004 may be similar to the primary system board, as discussed hereinabove in the example of FIG. 3A. The primary system board 1004 further includes a connector 1090, e.g., a PCIe connector receiver. As discussed herein in the example of FIG. 3A, the mounting system 1100 includes a plurality of second standoffs 1102 and a plurality of second fasteners 1252. Each cylindrical standoff 1102 includes complementary coupling elements (not labeled) as discussed in the example of FIG. 1, which may be configured to engage with the coupling element of the mounting system 1100 to couple the corresponding standoff 1102 to the chassis 1002. The primary system board 1004 is mounted on the plurality of cylindrical standoffs 1102 such that a compatible shoulder 1108 receives the primary system board 1104 and allows a bottom face 1010-1 of the primary system board 1004 to be mounted on a mounting face 1116 of the compatible shoulder 1108. Further, each fastener 1202 extends through a corresponding mounting hole 1014 of the primary system board 1004 and into a fastener hole 1110 of a corresponding standoff 1102 and engages a top face 1008-1 of the primary system board 1004 to releasably attach the primary system board 1004 to the base 1002B of the chassis 1002.

The riser assembly 801A of FIGS. 5A-5C is coupled to the information processing device 1001A such that the riser cage 802 is coupled to the sidewall 1002A of the chassis 1002 and a complementary connector 1080 of the riser card 904A is releasably connected to the connector 1090 of the primary system board 1004.

In the foregoing description, numerous details are set forth to provide an understanding of the subject matter disclosed herein. However, an implementation may be practiced without some or all of these details. Other implementations may include modifications, combinations, and variations from the details discussed above. It is intended that the following claims cover such modifications and variations.

What is claimed is:

1. A mounting system for printed circuit boards (PCBs), comprising:

a cylindrical standoff comprising:

a first end configured to be coupled to a support structure and a second end opposite to the first end having a fastener hole; and multi-tiered shoulders formed between the first and second ends and configured to interchangeably receive respectively compatible PCBs to mount the PCBs to the support structure, each shoulder of the multi-tiered shoulders comprising an upward facing mounting face, where respective mounting faces of the shoulders have different heights and different outer radii relative to one another such that the shoulders are respectively compatible with different ones of the PCBs having different PCB thicknesses and different mounting hole diameters; and a fastener, wherein, in a mounted state of a given PCB of the PCBs on the shoulder:

the mounting face of one of the shoulders that is compatible with the given PCB engages with a bottom face of the given PCB; and the fastener extends through the mounting hole of the given PCB and into the fastener hole of the cylindrical standoff and engages a top face of the given PCB to releasably attach the given PCB to the support structure.

2. The mounting system of claim 1, wherein the heights of the mounting faces are measured from the first end to the respective mounting faces, and wherein the outer radii of the mounting faces are measured from a central axis of the fastener hole to the respective mounting faces.

3. The mounting system of claim 1, wherein the heights of the shoulders decrease with each successive shoulder from the second end to the first end, and wherein the radii of the shoulders increase with each successive shoulder from the second end to the first end.

4. The mounting system of claim 1, wherein the height of each shoulder is set such that, in the mounted state of a compatible PCB of the PCBs on the shoulder, a top face of the compatible PCB is at a predetermined height from the first end of the cylindrical standoff, the predetermined height being the same for each of the shoulders.

5. The mounting system of claim 1, wherein the fastener comprises a head section and a body section having a shank portion connected to the head section and a threaded portion extending from the shank portion, and wherein the shank portion has a fixed length and a first diameter which is greater than each of a second diameter of the threaded portion and a third diameter of the fastener hole, and smaller than an outer diameter of a foremost shoulder of the shoulders at the second end.

6. The mounting system of claim 5, wherein, in the mounted state of the given PCB on the shoulder, the threaded portion extends through the mounting hole of the given PCB and into the fastener hole, the head section engages with the top face of the given PCB, and the shank portion engages with the mounting face of the foremost shoulder to prevent travel of the head section beyond a predetermined position and crushing of the given PCB between the fastener and the cylindrical standoff.

7. The mounting system of claim 1, wherein the fastener comprises a head section and a body section having threads connected to the head section, and wherein the head section has a first diameter which is greater than a largest mounting hole diameter out of the mounting hole diameters of the PCBs.

8. The mounting system of claim 7, wherein, in the mounted state of the given PCB on the shoulder, the body section extends into the mounting hole of the given PCB and into the fastener hole, and the head section engages with the top face of the given PCB.

9. An information processing device comprising:

a chassis;

a mounting system comprising:

a plurality of cylindrical standoffs, each comprising:

a first end coupled to the chassis and a second end opposite to the first end having a fastener hole; and multi-tiered shoulders formed between the first and second ends and configured to interchangeably receive respectively compatible printed circuit boards (PCBs), each shoulder of the multi-tiered shoulders comprising an upward facing mounting face, where respective mounting faces of the shoulders have different heights and different outer radii relative to one another such that the shoulders are respectively compatible with different ones of the PCBs having different PCB thicknesses and different mounting hole diameters;

a plurality of fasteners; and a first PCB having a first PCB thickness and a first mounting hole diameter compatible with a first shoulder of the shoulders, wherein a bottom face of the first PCB is engaged with the mounting face of the first shoulder of each of the plurality of cylindrical standoffs, and wherein each fastener of the plurality of fasteners extends through a corresponding mounting hole of the first PCB and into the fastener hole of a corresponding standoff of the plurality of cylindrical standoffs and engages a top face of the first PCB to releasably attach the first PCB to the chassis.

10. The information processing device of claim 9, wherein the heights of the mounting faces are measured from the first end to the respective mounting faces, and wherein the outer radii of the mounting faces are measured from a central axis of the fastener hole to the respective mounting faces.

11. The information processing device of claim 9, wherein the heights of the shoulders decrease with each successive shoulder from the second end to the first end, and wherein the radii of the shoulders increase with each successive shoulder from the second end to the first end.

12. The information processing device of claim 9, wherein the height of each shoulder is set such that, in a mounted state of a compatible PCB of the PCBs on a corresponding shoulder, a top face of the compatible PCB is at a predetermined height from the first end of the cylindrical standoff, the predetermined height being the same for each of the shoulders.

13. The information processing device of claim 9, wherein each fastener comprises a head section and a body section having a shank portion connected to the head section and a threaded portion extending from the shank portion, and wherein the shank portion has a fixed length and a first diameter which is greater than each of a second diameter of the threaded portion and a third diameter of the fastener hole, and smaller than an outer diameter of a foremost shoulder of the shoulders at the second end.

14. The information processing device of claim 13, wherein, in a mounted state of a compatible PCB of the PCBs on a corresponding shoulder, the threaded portion extends through the mounting hole of the compatible PCB and into the fastener hole of the corresponding standoff, the head section engages with the top face of the compatible PCB, and a shank portion engages with the mounting face of a foremost shoulder to prevent travel of the head section beyond a predetermined position and crushing of the compatible PCB between each fastener and the corresponding standoff.

15. The information processing device of claim 9, wherein each fastener comprises a head section and a body section having threads connected to the head section, and wherein the head section has a first diameter which is greater than a largest mounting hole diameter out of the mounting hole diameters of the PCBs.

16. The information processing device of claim 15, wherein, in a mounted state of a compatible PCB of the PCBs on a corresponding shoulder, the body section extends into the mounting hole of the compatible PCB and into the fastener hole of the corresponding standoff, and the head section engages with the top face of the compatible PCB.

17. The information processing device of claim 9, wherein radius of the mounting hole of a compatible PCB of the PCBs is smaller than a radius of a corresponding shoulder so as to allow a rim around the mounting hole of the compatible PCB to engage with the mounting face of the corresponding shoulder.

18. The information processing device of claim 17, wherein the radius of the mounting hole of the compatible PCB is greater than the radius of a next higher shoulder so as to allow the higher shoulder to pass through the mounting hole of the compatible PCB.

19. A riser assembly comprising:

a riser cage;

a mounting system comprising:

a plurality of cylindrical standoffs, each comprising:

a first end coupled to the riser cage and a second end opposite to the first end having a fastener hole; and multi-tiered shoulders formed between the first and second ends and configured to interchangeably receive respectively compatible riser cards, each shoulder of the multi-tiered shoulders comprising an upward facing mounting face, where respective mounting faces of the shoulders have different heights and different outer radii relative to one another such that the shoulders are respectively compatible with different ones of the riser cards having different riser card thicknesses and different mounting hole diameters; and a plurality of fasteners, and a first riser card having a first riser card thickness and a first mounting hole diameter compatible with a first shoulder of the shoulders, wherein a bottom face of the first riser card is engaged with the mounting face of the first shoulder of each of the plurality of cylindrical standoffs, and wherein each fastener of the plurality of fasteners extends through a corresponding mounting hole of the first riser card and into the fastener hole of a corresponding standoff of the plurality of cylindrical standoffs and engages a top face of the first riser card to releasably attach the first riser card to the riser cage.

20. An information processing device comprising:

a chassis;

a primary system board comprising a connector, coupled to the chassis via a second mounting system comprising a plurality of second cylindrical standoffs and a plurality of second fasteners; and the riser assembly of claim 19, coupled to the information processing device such that the riser cage is coupled to the chassis and a complementary connector of the riser card is releasably connected to the connector of the primary system board.

* * * * *